(12) United States Patent
Burak et al.

(10) Patent No.: US 9,401,692 B2
(45) Date of Patent: Jul. 26, 2016

(54) ACOUSTIC RESONATOR HAVING COLLAR STRUCTURE

(71) Applicant: Avago Technologies General IP (Singapore) Pte. Ltd., Singapore (SG)

(72) Inventors: Dariusz Burak, Fort Collins, CO (US); Alexandre Shirakawa, San Jose, CA (US); John Choy, Westminster, CO (US); Phil Nikkel, Loveland, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 581 days.

(21) Appl. No.: 13/663,449

(22) Filed: Oct. 29, 2012

(65) Prior Publication Data

US 2014/0118091 A1 May 1, 2014

(51) Int. Cl.
*H03H 9/02* (2006.01)
*H03H 9/13* (2006.01)
*H03H 9/17* (2006.01)

(52) U.S. Cl.
CPC ....... *H03H 9/02118* (2013.01); *H03H 9/02157* (2013.01); *H03H 9/132* (2013.01); *H03H 9/173* (2013.01)

(58) Field of Classification Search
CPC .............. H03H 9/02118; H03H 9/173; H03H 9/02157; H03H 9/132
USPC ........... 333/133, 186–191; 310/324, 365, 312
See application file for complete search history.

(56) References Cited

U.S. PATENT DOCUMENTS

| | | | |
|---|---|---|---|
| 4,633,285 A | 12/1986 | Hunsinger et al. |
| 4,916,520 A | 4/1990 | Kurashima |
| 4,933,743 A | 6/1990 | Thomas et al. |
| 5,006,478 A | 4/1991 | Kobayashi et al. |
| 5,087,959 A | 2/1992 | Omori et al. |
| 5,587,620 A | 12/1996 | Ruby et al. |
| 5,698,928 A | 12/1997 | Mang et al. |
| 5,817,446 A | 10/1998 | Lammert |
| 5,825,092 A | 10/1998 | Eelgado et al. |
| 5,873,153 A | 2/1999 | Ruby et al. |
| 6,107,721 A | 8/2000 | Lakin |
| 6,291,931 B1 | 9/2001 | Lakin |
| 6,384,697 B1 | 5/2002 | Ruby |
| 6,396,200 B2 | 5/2002 | Misu et al. |
| 6,424,237 B1 | 7/2002 | Ruby et al. |
| 6,507,983 B1 | 1/2003 | Ruby et al. |

(Continued)

FOREIGN PATENT DOCUMENTS

| | | |
|---|---|---|
| CN | 101170303 | 4/2008 |
| EP | 0880227 | 11/1998 |

(Continued)

OTHER PUBLICATIONS

"Co-pending U.S. Appl. No. 13/662,425, filed Oct. 27, 2012".

(Continued)

*Primary Examiner* — Benny Lee
*Assistant Examiner* — Jorge Salazar, Jr.

(57) ABSTRACT

A bulk acoustic wave (BAW) resonator structure comprises a first electrode disposed over a substrate, a first piezoelectric layer disposed over the first electrode, a second electrode disposed over the first piezoelectric layer, and a collar structure disposed around a perimeter of an active region defined by an overlap between the first electrode, the second electrode, and the piezoelectric layer.

46 Claims, 17 Drawing Sheets

(56) References Cited

U.S. PATENT DOCUMENTS

| | | | |
|---|---|---|---|
| 6,548,943 B2 | 4/2003 | Kaitila et al. |
| 6,607,934 B2 | 8/2003 | Chang et al. |
| 6,617,751 B2 | 9/2003 | Sunwoo et al. |
| 6,709,776 B2 | 3/2004 | Noguchi et al. |
| 6,864,619 B2 | 3/2005 | Aigner et al. |
| 6,985,051 B2 | 1/2006 | Nguyen et al. |
| 7,199,683 B2 | 4/2007 | Thalhammer |
| 7,233,218 B2 | 6/2007 | Park et al. |
| 7,275,292 B2 | 10/2007 | Ruby et al. |
| 7,280,007 B2 | 10/2007 | Feng et al. |
| 7,345,410 B2 | 3/2008 | Grannen et al. |
| 7,358,831 B2 | 4/2008 | Larson, III et al. |
| 7,377,168 B2 | 5/2008 | Liu |
| 7,388,454 B2 | 6/2008 | Ruby et al. |
| 7,459,990 B2 | 12/2008 | Wunnicke et al. |
| 7,466,213 B2 | 12/2008 | Lobl et al. |
| 7,486,213 B2 | 2/2009 | Yu et al. |
| 7,575,292 B2 | 8/2009 | Furukawa |
| 7,629,865 B2 | 12/2009 | Ruby |
| 7,642,693 B2 | 1/2010 | Akiyama et al. |
| 7,889,024 B2 | 2/2011 | Bradley et al. |
| 7,965,019 B2 | 6/2011 | Gabl et al. |
| 7,986,198 B2 | 7/2011 | Nakatsuka et al. |
| 8,008,993 B2 | 8/2011 | Milsom et al. |
| 8,030,823 B2 | 10/2011 | Sinha et al. |
| 8,253,513 B2 | 8/2012 | Zhang |
| 8,330,325 B1 | 12/2012 | Burak et al. |
| 8,507,919 B2 | 8/2013 | Ishikura |
| 8,575,820 B2 | 11/2013 | Shirakawa et al. |
| 8,872,604 B2 | 10/2014 | Burak |
| 8,896,395 B2 | 11/2014 | Burak et al. |
| 2001/0026951 A1 | 10/2001 | Vergani et al. |
| 2002/0153965 A1 | 10/2002 | Ruby et al. |
| 2003/0132493 A1 | 7/2003 | Kang et al. |
| 2004/0046622 A1 | 3/2004 | Aigner et al. |
| 2004/0056735 A1 | 3/2004 | Nomura et al. |
| 2004/0092234 A1 | 5/2004 | Pohjonen |
| 2004/0099898 A1 | 5/2004 | Grivna et al. |
| 2004/0124952 A1 | 7/2004 | Tikka |
| 2004/0129079 A1 | 7/2004 | Kato et al. |
| 2004/0150293 A1 | 8/2004 | Unterberger |
| 2004/0150296 A1 | 8/2004 | Park et al. |
| 2004/0166603 A1 | 8/2004 | Carley |
| 2004/0195937 A1 | 10/2004 | Matsubara et al. |
| 2004/0212458 A1 | 10/2004 | Lee |
| 2004/0246075 A1* | 12/2004 | Bradley et al. ............ 333/187 |
| 2004/0257171 A1 | 12/2004 | Park et al. |
| 2004/0257172 A1 | 12/2004 | Schmidhammer et al. |
| 2004/0263287 A1 | 12/2004 | Ginsburg et al. |
| 2005/0012570 A1 | 1/2005 | Korden et al. |
| 2005/0012716 A1 | 1/2005 | Mikulin et al. |
| 2005/0023931 A1 | 2/2005 | Bouche et al. |
| 2005/0030126 A1 | 2/2005 | Inoue et al. |
| 2005/0036604 A1 | 2/2005 | Scott |
| 2005/0057117 A1 | 3/2005 | Nakatsuka et al. |
| 2005/0057324 A1 | 3/2005 | Onishi et al. |
| 2005/0068124 A1 | 3/2005 | Stoemmer |
| 2005/0082626 A1 | 4/2005 | Leedy |
| 2005/0093396 A1 | 5/2005 | Larson, III et al. |
| 2005/0093653 A1 | 5/2005 | Larson, III |
| 2005/0093654 A1 | 5/2005 | Larson, III et al. |
| 2005/0093655 A1 | 5/2005 | Larson, III et al. |
| 2005/0093657 A1 | 5/2005 | Larson, III et al. |
| 2005/0093658 A1 | 5/2005 | Larson, III et al. |
| 2005/0093659 A1 | 5/2005 | Larson, III et al. |
| 2005/0104690 A1 | 5/2005 | Larson, III et al. |
| 2005/0110598 A1 | 5/2005 | Larson, III |
| 2005/0128030 A1 | 6/2005 | Larson, III et al. |
| 2005/0140466 A1 | 6/2005 | Larson, III et al. |
| 2005/0167795 A1 | 8/2005 | Higashi |
| 2005/0193507 A1 | 9/2005 | Ludwiczak |
| 2005/0206271 A1 | 9/2005 | Higuchi et al. |
| 2005/0206483 A1 | 9/2005 | Pashby et al. |
| 2005/0275486 A1 | 12/2005 | Feng et al. |
| 2006/0081048 A1 | 4/2006 | Mikado et al. |
| 2006/0087199 A1 | 4/2006 | Larson, III et al. |
| 2006/0103492 A1 | 5/2006 | Feng et al. |
| 2006/0119453 A1 | 6/2006 | Fattinger et al. |
| 2006/0121686 A1 | 6/2006 | Wei et al. |
| 2006/0125489 A1 | 6/2006 | Feucht et al. |
| 2006/0132262 A1 | 6/2006 | Fazzio et al. |
| 2006/0160353 A1 | 7/2006 | Gueneau de Mussy et al. |
| 2006/0164183 A1 | 7/2006 | Tikka et al. |
| 2006/0185139 A1 | 8/2006 | Larson, III et al. |
| 2006/0197411 A1 | 9/2006 | Hoen et al. |
| 2006/0238070 A1 | 10/2006 | Costa et al. |
| 2006/0284707 A1 | 12/2006 | Larson, III et al. |
| 2006/0290446 A1 | 12/2006 | Aigner et al. |
| 2007/0035364 A1 | 2/2007 | Sridhar et al. |
| 2007/0080759 A1 | 4/2007 | Jamneala et al. |
| 2007/0084964 A1 | 4/2007 | Sternberger |
| 2007/0085213 A1 | 4/2007 | Anh et al. |
| 2007/0085447 A1 | 4/2007 | Larson, III et al. |
| 2007/0085631 A1 | 4/2007 | Larson, III et al. |
| 2007/0085632 A1 | 4/2007 | Larson, III et al. |
| 2007/0086274 A1 | 4/2007 | Nishimura et al. |
| 2007/0090892 A1 | 4/2007 | Larson, III et al. |
| 2007/0170815 A1 | 7/2007 | Unkrich |
| 2007/0171002 A1 | 7/2007 | Unkrich |
| 2007/0176710 A1 | 8/2007 | Jamneala et al. |
| 2007/0205850 A1 | 9/2007 | Jamneala et al. |
| 2008/0055020 A1 | 3/2008 | Handtmann et al. |
| 2008/0179995 A1* | 7/2008 | Umeda ............... H03H 9/02086 310/324 |
| 2008/0258842 A1 | 10/2008 | Ruby et al. |
| 2008/0297279 A1 | 12/2008 | Thalhammer et al. |
| 2008/0297280 A1 | 12/2008 | Thalhammer et al. |
| 2009/0064498 A1 | 3/2009 | Mok et al. |
| 2009/0096550 A1 | 4/2009 | Handtmann et al. |
| 2009/0102319 A1 | 4/2009 | Nakatsuka et al. |
| 2010/0039000 A1 | 2/2010 | Milson et al. |
| 2010/0052176 A1 | 3/2010 | Kamada et al. |
| 2010/0102358 A1 | 4/2010 | Lanzieri et al. |
| 2010/0148637 A1 | 6/2010 | Satou |
| 2010/0327697 A1 | 12/2010 | Choy et al. |
| 2010/0327994 A1 | 12/2010 | Choy et al. |
| 2011/0092067 A1 | 4/2011 | Bonilla et al. |
| 2011/0121916 A1 | 5/2011 | Barber et al. |
| 2011/0180391 A1 | 7/2011 | Larson, III et al. |
| 2011/0204996 A1 | 8/2011 | Gilbert et al. |
| 2011/0266917 A1 | 11/2011 | Metzger et al. |
| 2011/0266925 A1 | 11/2011 | Ruby et al. |
| 2012/0177816 A1 | 7/2012 | Larson, III et al. |
| 2012/0218055 A1 | 8/2012 | Burak |
| 2012/0218056 A1 | 8/2012 | Burak |
| 2012/0218060 A1 | 8/2012 | Burak et al. |
| 2012/0248941 A1 | 10/2012 | Shirakawa et al. |
| 2013/0003377 A1 | 1/2013 | Sakai et al. |
| 2013/0038408 A1 | 2/2013 | Burak et al. |
| 2013/0082799 A1 | 4/2013 | Zuo et al. |
| 2013/0106534 A1 | 5/2013 | Burak |
| 2013/0127300 A1 | 5/2013 | Umeda et al. |
| 2013/0155574 A1 | 8/2013 | Doolittle |
| 2013/0205586 A1 | 8/2013 | Takada et al. |
| 2013/0221454 A1 | 8/2013 | Dunbar et al. |
| 2013/0235001 A1 | 9/2013 | Yun et al. |
| 2013/0241673 A1 | 9/2013 | Yokoyama et al. |
| 2013/0314177 A1 | 11/2013 | Burak et al. |
| 2013/0334625 A1 | 12/2013 | Lin |
| 2014/0111288 A1 | 4/2014 | Nikkel et al. |
| 2014/0118087 A1 | 5/2014 | Burak et al. |
| 2014/0118088 A1 | 5/2014 | Burak et al. |
| 2014/0118091 A1 | 5/2014 | Burak et al. |
| 2014/0118092 A1 | 5/2014 | Burak et al. |
| 2014/0159548 A1 | 6/2014 | Burak et al. |
| 2014/0224941 A1 | 8/2014 | Gitter |
| 2014/0225682 A1 | 8/2014 | Burak |

FOREIGN PATENT DOCUMENTS

| | | |
|---|---|---|
| JP | 10173479 | 6/1998 |
| JP | 2003-017964 | 1/2003 |
| JP | 2007208845 | 8/2007 |
| JP | 2008211394 | 9/2008 |

(56) References Cited

FOREIGN PATENT DOCUMENTS

| | | |
|---|---|---|
| JP | 1471443 | 6/2010 |
| KR | 20020050729 | 6/2002 |
| KR | 1020030048917 | 6/2003 |
| WO | WO9937023 | 7/1999 |
| WO | WO2005043752 | 5/2005 |
| WO | WO2006079353 | 8/2006 |
| WO | 2007085332 | 8/2007 |
| WO | WO2013065488 | 5/2013 |

OTHER PUBLICATIONS

"Co-pending U.S. Appl. No. 13/662,460, filed Oct. 27, 2012".
"Co-pending U.S. Appl. No. 13/766,993, filed Feb. 14, 2013".
"Co-pending U.S. Appl. No. 13/767,754, filed Feb. 14, 2013".
"Co-pending U.S. Appl. No. 13/955,744, filed Jul. 31, 2013".
Aigner, Robert, "SAW, BAW And The Future Of Wireless", May 6, 2013, pp. 1-4 May 6, 2013.
El Hassan, M. et al, "Techniques For Tuning BAW-SMR Resonators For The 4th Generation Of Mobile Communications", *Intech* 2013, 421-442.
Pineda, Humberto, "Thin-Film Bulk Acoustic Wave Resonators—FBAR", Bellaterra, Monpelier Dec. 2007, 1-241.
Co-pending U.S. Appl. No. 13/074,094, filed Mar. 29, 2011.
Co-pending U.S. Appl. No. 13/036,489, filed Feb. 28, 2011.
Co-pending U.S. Appl. No. 13/074,262, filed Mar. 29, 2011.
Co-pending U.S. Appl. No. 13/101,376, filed May 5, 2011.
Co-pending U.S. Appl. No. 13/161,946, filed Jun. 16, 2011.
Co-pending U.S. Appl. No. 13/286,038, filed Oct. 31, 2011.
Lee, et al. "Development of High-Quality FBAR Devices for Wireless Applications Employing Two-Step Annealing Treatments", IEEE Microwave and Wireless Components Letters, vol. 21, No. 11, Nov. 2011.
"Co-pending U.S. Appl. No. 13/654,718, filed Oct. 18, 2012".
"Co-pending U.S. Appl. No. 13/658,024, filed Oct. 23, 2012".
"Co-pending U.S. Appl. No. 13/660,941, filed Oct. 25, 2012".
"Co-pending U.S. Appl. No. 13/663,449, filed Oct. 29, 2012".
G.W. Archibald "Experimental results of bulk acoustic wave transverse graded electrode patterns", Proceedings of the 1998 IEEE International Frequency Control Symposium, Publication Year: 1998, pp. 477-483.
Kazuhiko Kano, et al., "Enhancement of Piezoelectric Response in Scandium Aluminum Nitride Alloy Thin Films prepared by Dual Reactive Co-Sputtering", vol. 17, 2012.
Milena Moriera, et al. "Aluminum scandium nitride thin-film bulk acoustic resonators for wide band applications", Vacuum 86 (2011) 23-26.
Kerherve, "BAW Technologies for Radiofrequency Filters and Duplexers", Nov. 2011.
Lin, "Temperature Compensation of Aluminum Nitride Lamb Wave Resonators Utilizing the Lowest-Order Symmetric Mode", Electrical Engineering and Computer Sciences University of California at Berkeley, Dec. 14, 2012.
Umeda et al, "Piezoelectric Properties of ScAlN Thin Films for PIEZO-MEMS Devices", MEMS 2013, Taipei, Taiwan, Jan. 20-24, 2013, pp. 733-736.
Machine translation of WO2006079353.
Machine translation of WO2013065488.
Office Action mailed Jan. 28, 2015 in U.S. Appl. No. 13/658,024.
Machine translation of JP2003-017964.
Machine translation of CN101170303.
A.C. Lynch, "Precise measurements on dielectric and magnetic materials", IEEE Transactions on Instrumentation and Measurement, vol. IM-23, No. 4, Dec. 1974, p. 425-431.
Office Action mailed Mar. 6, 2015 in U.S. Appl. No. 13/781,491.
Machine translation of WO2007085332, published Aug. 2, 2007.
English abstract of JP4471443, published Jun. 2, 2010.
Pensala, "Thin Film Bulk Acoustic Wave Devices: Performance Optimization and Modeling", VTT Publications 756, http://www.vtt.fi.inf/pdf/publications/2011/P756.pdf, Feb. 25, 2011, 1-108.
Tang, et al., "Micromachined Bulk Acoustic Resonator With A Raised Frame", 16th International Conference on Mechatronics Technology, Oct. 16-19, 2012, Tianjin, China.
Pandey, et al., "Anchor Loss Reduction in Resonant MEMS using MESA Structures", Proceedings of the 2nd IEEE International Conference on Nano/Micro Engineered and Molecular Systems, Bangkok, Thailand Jan. 16-19, 2007, 380-885.
Tas, et al., "Reducing Anchor Loss in Micromechanical Extensional Mode Resonators", IEEE Transactions on Ultrasonics, Ferroelectrics and Frequency Control, vol. 57, No. 2. Feb. 2010, 448-454.
Machine translation of JP2007208845, published Aug. 16, 2007.
Machine translation of JP2008211394, published Sep. 11, 2008.
IEEE Xplore Abstract for Suppression of Acoustic Energy Leakage in FBARs with Al Bottom Electrode: FEM Simulation and Experimental Results, 2007 IEEE Ultrasonics Symposium, Oct. 28-31, 2007, 1657-1660.
Ohara, et al., "Suppression of Acoustic Energy Leakage in FBARs with Al Bottom Electrode: FEM Simulation and Experimental Results", 2007 IEEE Ultrasonics Symposium, Oct. 28-31, 2007, 1657-1660.

\* cited by examiner

ACOUSTIC RESONATOR HAVING COLLAR STRUCTURE

BACKGROUND

Acoustic resonators can be used to implement signal processing functions in various electronic applications. For example, some cellular phones and other communication devices use acoustic resonators to implement frequency filters for transmitted and/or received signals.

Several different types of acoustic resonators can be used according to different applications. For example, different applications may use bulk acoustic wave (BAW) resonators such as thin film bulk acoustic resonators (FBARs), coupled resonator filters (CRFs), double bulk acoustic resonators (DBARs), or solidly mounted resonators (SMRs).

FIG. 1A is a cross-sectional view of an example acoustic resonator 100, and FIG. 1B is a top view of acoustic resonator 100. In FIG. 1B, a line A-A' indicates the location of the cross-sectional view shown in FIG. 1A.

As illustrated in FIG. 1A, acoustic resonator 100 comprises a piezoelectric layer 110 located between a bottom electrode 105 and a top electrode 115. The designations top electrode and bottom electrode are for convenience of explanation, and they do not represent any limitation with regard to the spatial arrangement, positioning, or orientation of acoustic resonator 100. As illustrated in FIG. 1B, acoustic resonator 100 is formed with a polygonal shape in which each side of the polygon has a different length from the other sides. This type of shape is referred to as an apodized shape, and is used to achieve desired acoustic characteristics in acoustic resonator 100. Although FIG. 1B shows only top electrode 115 with the apodized shape, other portions of acoustic resonator 100 may have a similar shape.

During typical operation, an electric field is applied between bottom and top electrodes 105 and 115. In response to this electrical field, the reciprocal or inverse piezoelectric effect causes acoustic resonator 100 to mechanically expand or contract depending on the polarization of the piezoelectric material, as indicated by an arrow in FIG. 1A. As the electrical field varies over time, an acoustic wave is generated in piezoelectric layer 110, and the acoustic wave propagates through acoustic resonator 100. For example, in some implementations, the acoustic wave propagates in parallel with the electric field as a longitudinal wave, or along the mechanical interfaces of acoustic resonator 100 as a lateral wave.

The longitudinal acoustic wave, usually called a piston mode, is electrically excited by a vertical electric field between electrode plates and has a form of laterally uniform motion with the boundaries of motion determined by an overlap of top and bottom electrodes and the piezoelectric material. Lateral acoustic waves, usually called lateral modes, are excited at the edges of the piston mode motion and facilitate continuity of appropriate mechanical particle velocities and stresses between electrically excited and non-excited regions. In general, lateral modes are specific forms of motion supported by a mechanical stack and have both longitudinal and shear components. The lateral modes can either propagate freely (so called propagating modes) or exponentially decay (so called evanescent and complex modes) from the point of excitation. These modes can be excited both by a lateral structural discontinuity (for example, at an interface between regions of different thicknesses in a membrane, or at the edge of a top or bottom electrode) or by electric field discontinuity (for example, at an edge of a top electrode where the electric field is terminated abruptly). The lateral modes generally have a deleterious impact on FBAR functionality.

For longitudinal waves, where a thickness d of piezoelectric layer 110 and of the top and bottom electrodes equals an odd (1, 3, 5 . . . ) integer multiple of half the wavelength $\lambda$ of the acoustic waves, resonance states and/or acoustic resonance vibrations will occur. Because each acoustic material has a different propagation velocity for the acoustic wave, the fundamental resonance frequency for any given polarization (for example, corresponding to horizontal shear HS, thickness shear TS and thickness extensional TE lowest and higher order modes) will then be inversely proportional to a weighted sum of all thicknesses of the resonator layers.

The piezoelectric properties and, therefore the resonance properties of an acoustic resonator depend on various factors, such as the piezoelectric material, the production method, the polarization impressed upon the piezoelectric material during manufacturing, and the size of the crystals, to name but a few.

FIG. 2 is a graph illustrating a logarithmic input, impedance response versus frequency for an example acoustic resonator. As illustrated in FIG. 2, the input impedance of the example acoustic resonator exhibits a sharp negative-going (in logarithmic scale) peak from a series resonance at a lower frequency Fs, and a sharp positive-going (again, in logarithmic scale) peak from a parallel resonance at a higher frequency Fp.

FIGS. 3A through 3C are circuit diagrams illustrating electrical models of a BAW resonator such as an FBAR. The model of FIG. 3A is a modified Butterworth-Van Dyke model (MBVD) model. The frequency response of this model is a pass-band response, with frequency response for frequencies below the pass-band being attenuated by capacitances Cm and Co, and with frequency response for frequencies above the pass-band being attenuated by an inductance Lm. As illustrated in FIG. 3B, at series resistance, the BAW resonator can be modeled by a series-resonant combination of inductance Lm and capacitance Cm in series with a parasitic resistance Rs. As illustrated in FIG. 3C, at parallel resonance, the BAW resonator can be modeled by a parallel-resonant combination of inductance Lm and capacitance Co in parallel with a parasitic resistance Rp. Resistances Rs and Rp represent various heat losses and acoustic losses within the acoustic resonator.

An acoustic resonator can be employed in various types of electrical filters, such as radio frequency (RF) filters and microwave filters. In addition, acoustic resonators can be combined in various ways to produce a variety of filter configurations. The performance of an RF or microwave filter constructed with an acoustic resonator depends on the performance of the acoustic resonator, which can be expressed in terms of the resonator's parallel resistance Rp, series resistance Rs and its electromechanical coupling coefficient $Kt^2$.

Referring to FIGS. 2, 3A, 3B and 3C, the series resistance Rs is the smallest value of magnitude of input impedance, and series resonance frequency Fs is a frequency at which that minimum occurs. The parallel resistance Rp is the largest value of magnitude of input impedance, and parallel resonance frequency Fp is a frequency at which that maximum occurs. The electromechanical coupling coefficient $Kt^2$ is a normalized difference between parallel and series resonance frequencies Fp and Fs and is typically expressed in percent values (%) of the series resonance frequency Fs. In general, devices with higher Rp or $Kt^2$ and lower Rs are considered to have superior performance than devices with higher Rs or lower Rp or lower $Kt^2$. Thus, other things being equal, it is desirable to provide a filter with an acoustic resonator having a higher Rp or $Kt^2$ and lower Rs.

An acoustic resonator can also be employed in an oscillator. Where an acoustic resonator is employed in an oscillator, the performance of the oscillator (e.g., phase noise) is affected by the Rp or $Kt^2$ of the acoustic resonator. Moreover, as with filters, it is also desirable to provide an oscillator with an acoustic resonator having a higher Rp or $Kt^2$ and lower Rs.

Unfortunately, many design choices that increase the Rp of an acoustic resonator tend to decrease the $Kt^2$ of the acoustic resonator, and vice versa. In other words, there is generally a tradeoff between Rp and $Kt^2$. Consequently, applications requiring high Rp may be required to sacrifice $Kt^2$, and applications requiring a high $Kt^2$ may be required to sacrifice Rp. In addition, because mechanisms determining Rp values in acoustic resonators involve scattering of multiple modes at various impedance mismatch interfaces, effectiveness of design choices to increase Rp, for example, depend on specific stack design, which is however determined by specific application of the resonator. Thus designs, frames for instance, aimed for increasing Rp may work for some acoustic stacks and may not work for the different acoustic stacks. What is needed, therefore, are acoustic resonator structures that can provide appropriate values of Rp and electromechanical coupling coefficient $Kt^2$ according to the demands of different applications.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
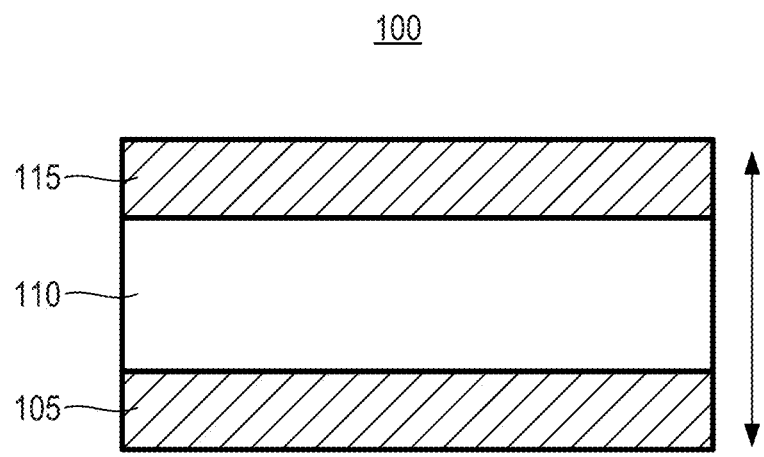
FIG. 1A is a cross-sectional view of an example acoustic resonator.

In the following detailed description, for purposes of explanation and not limitation, example embodiments disclosing specific details are set forth in order to provide a thorough understanding of the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms 'a', 'an' and 'the' include both singular and plural referents, unless the context clearly dictates otherwise. Thus, for example, 'a device' includes one device and plural devices. The terms 'substantial' or 'substantially' mean to within acceptable limits or degree. The term 'approximately' means to within an acceptable limit or amount to one of ordinary skill in the art. Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

The disclosed embodiments relate generally to acoustic resonators comprising FBARs, DBARs, CRFs, and SMRs.

For simplicity of explanation, several embodiments are described in the context of FBAR technologies; however, the described concepts can be adapted for use in other types of acoustic resonators. Certain details of acoustic resonators as well as related materials and methods of fabrication may be found in one or more of the following commonly owned U.S. Patents, Patent Application Publications and Patent Applications: U.S. Pat. No. 6,107,721, to Lakin; U.S. Pat. Nos. 5,587, 620, 5,873,153 and 6,507,983 to Ruby, et al.; U.S. Pat. No. 7,629,865 to Ruby, et al.; U.S. Pat. No. 7,280,007 to Feng, et al.; U.S. Patent Application Publication No. 2007/0205850 to Jamneala, et al. now U.S. Pat. No. 8,981,876 B2; U.S. Pat. No. 7,388,454 to Richard C. Ruby, et al; U.S. Patent Application Publication No. 2010/0327697 to Choy, et al. now U.S. Pat. No. 8,248,185 B2; and U.S. Patent Application Publication No. 2010/0327994 to Choy, et al. now U.S. Pat. No. 8,902, 023 B2 Examples of DBARs and CRFs as well as their materials and methods of fabrication, may be found in U.S. Pat. No. 7,889,024 to Paul Bradley et al., U.S. patent application Ser. No. 13/074,094 of Shirakawa et al., and filed on Mar. 29, 2011, U.S. patent application Ser. No. 13/036,489 of Burak et al., and filed on Feb. 28, 2011, U.S. patent application Ser. No. 13/074,262 to Burak, et al. filed on Mar. 29, 2011, U.S. patent application Ser. No. 13/101,376 of Burak et al., and filed on May 5, 2011, and U.S. patent application Ser. No. 13/161,946 to Burak, et al., and filed on Jun. 16, 2011. The disclosures of these patents, patent application publications and patent applications are specifically incorporated herein by reference. It is emphasized that the components, materials and method of fabrication described in these patents and patent applications are representative and other methods of fabrication and materials within the purview of one of ordinary skill in the art are contemplated.

Figure 4:
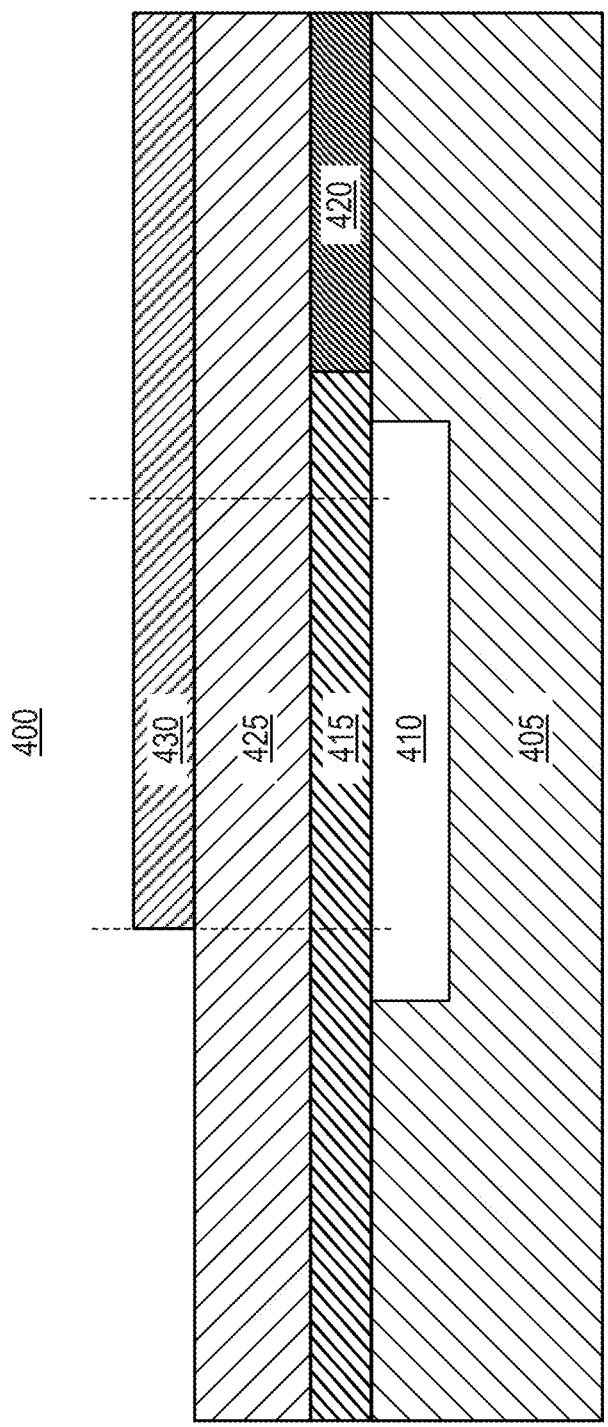
FIG. 4 is a cross-sectional view of a reference FBAR used for comparison with FBARs having a collar structure.

In certain embodiments, an acoustic resonator comprises top and bottom electrodes, a piezoelectric layer formed between the top and bottom electrodes, and a collar structure formed around an active region defined by an overlap between top and bottom electrodes, and the piezoelectric layer, over an acoustic reflector (e.g., cavity depicted in FIG. 4). The collar structure is typically formed of a relatively thick dielectric region of finite width, and it can be located above the top electrode, below the bottom electrode, or between the bottom electrode and the piezoelectric layer. Alternatively, the collar layer may be split into several layers formed at multiple locations mentioned above. Also, the collar layer may be formed inside any of the layers comprising the acoustic resonator, for instance inside the piezoelectric layer.

The collar structure is typically designed so that it has substantially the same cutoff frequency and modal distribution of a main non-propagating (evanescent mode, for instance) as the cutoff frequency and modal distribution of the piston mode in the active region. This prevents acoustic energy in the piston mode from being converted into unwanted propagating modes in regions of the collar structure and the main membrane. More particularly, it improves confinement of the piston mode within the active region while suppressing the excitation of spurious propagating lateral modes inside and outside of the active region. This, in turn, may reduce overall scattering loss and enhance the parallel resistance Rp of the acoustic resonator.

In the absence of the collar structure, there is a significant acoustic impedance discontinuity at the edge of the top electrode for an electrically excited piston mode. Because the electric field is also terminated at the edge of top electrode, that edge will cause both mechanical and electrical excitation of evanescent, propagating and complex modes supported by the structure. Evanescent and complex modes decay exponentially, so a wide enough collar structure will suppress them. Moreover, propagating modes may be suppressed by forming the collar structure with a proper width. Additionally, a collar structure extending over (or under) the top electrode may act as an integrated frame, thus it may minimize the amplitude of electrically excited piston mode before the top electrode edge and provide additional acoustic impedance discontinuities to suppress propagating modes.

FIG. 4 is a cross-sectional view of an FBAR 400 without a collar structure. FBAR 400 is presented as a reference device that can be used for comparison with FBARs having a collar structure. FBAR 400 has many of the same features as other embodiments described below, so a detailed description of these features may be omitted from the discussion of other embodiments in an effort to avoid redundancy.

Referring to FIG. 4, FBAR 400 comprises a substrate 405, a bottom electrode 415, a planarization layer 420, a piezoelectric layer 425, and a top electrode 430. Bottom electrode 415 and planarization layer 420 are both formed on substrate 405, piezoelectric layer 425 is formed on top of bottom electrode 415 and planarization layer 420, and top electrode 430 is formed on piezoelectric layer 425. Collectively, bottom and top electrodes 415 and 430 and the piezoelectric layer 425 define an acoustic stack of FBAR 400, and a region of overlap between these features over a trench 410 defines an active region of the acoustic stack.

In FIG. 4, the active region is shown as a region between a pair of dotted lines, and as such is defined by the overlap of bottom and top electrodes 415 and 430 and the piezoelectric layer 425. The active region does not include the full extent of overlap between bottom and top electrodes 415 and 430 and piezoelectric layer 425 as shown in FIG. 4, because the illustrated right side of top electrode 430 is a connecting edge and it is not intended to modify the characteristic electrical impedance at operating frequency range of FBAR 400 in any significant way. However, an overlap between bottom electrode 415, piezoelectric layer 425, top electrode 430 and the substrate 405 in the top electrode connecting edge, usually referred to as "dead FBAR", may cause significant acoustic energy loss since piston mode is electrically excited all the way to the outer perimeter of cavity 410 in that region, where it may couple to propagating modes supported by substrate 405 region. Beneficially, application of collar to that region may minimize that unwanted energy loss by mass-loading the top-electrode connecting edge (shown of the right side of FIG. 5A below) which in turn significantly lowers the amplitude of electrically excited piston mode at an outer edge of trench 410. A peripheral region includes portions of FBAR 400 outside of the active region. As illustrated in several figures described below, a collar structure may be formed in a portion of the peripheral region, and this portion may be referred to as a collar region.

Figure 1B:
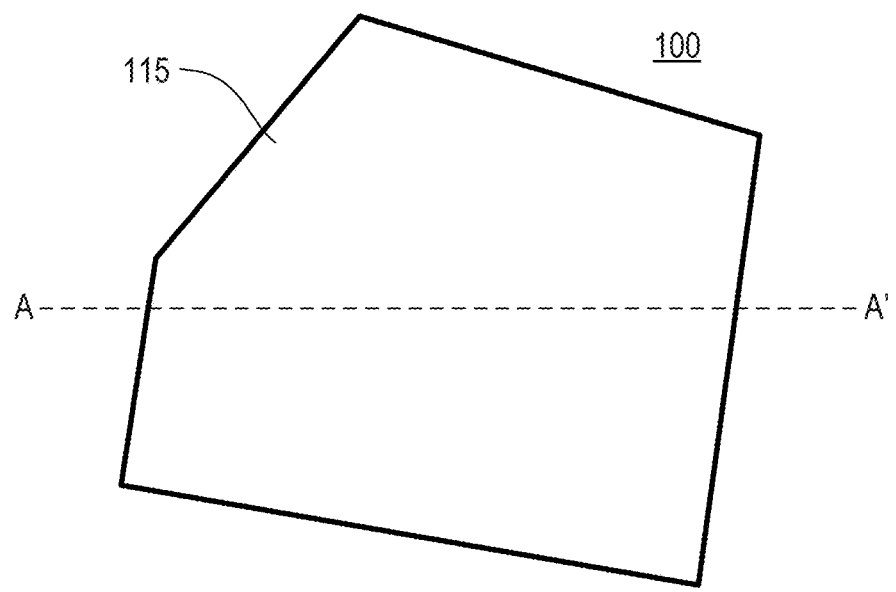
FIG. 1B is a top view of the acoustic resonator shown in FIG. 1A.
Figure 2:
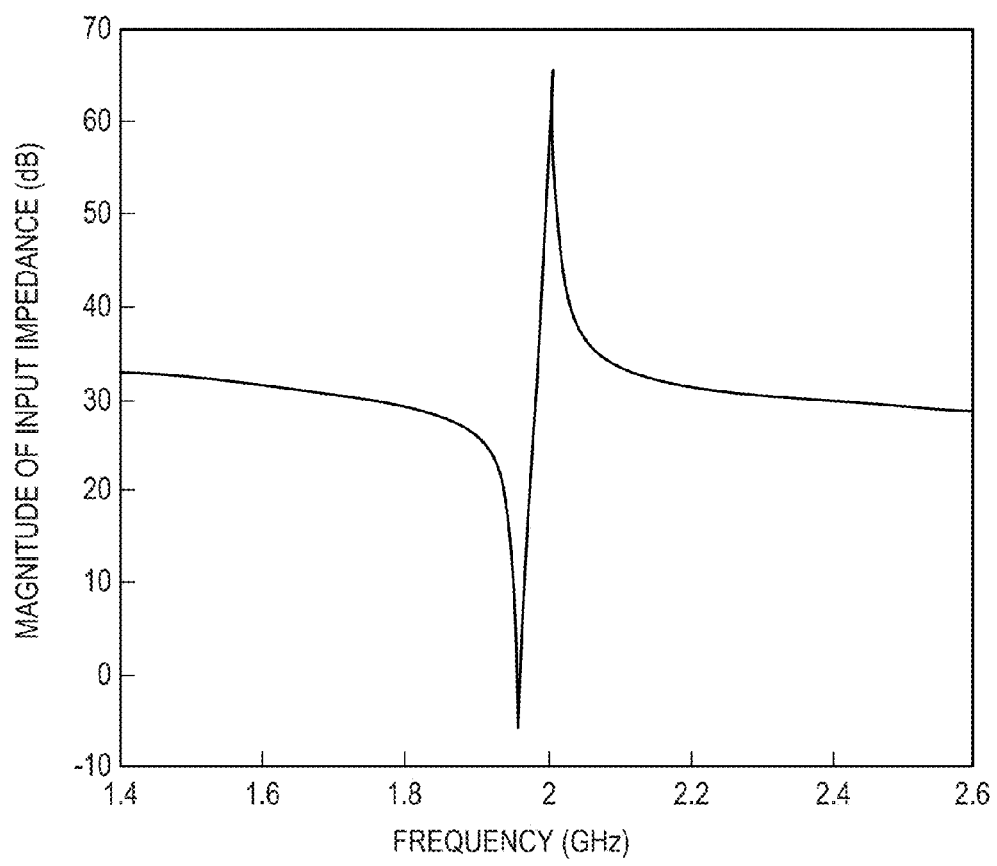
FIG. 2 illustrates an example input impedance response versus frequency for an acoustic resonator.
Figure 3A:
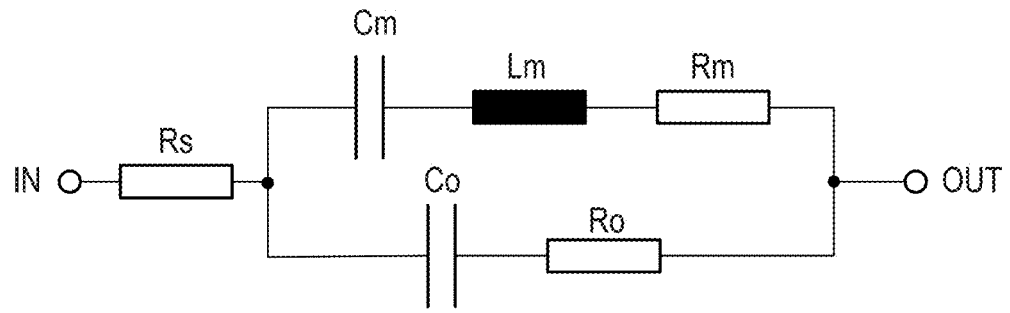
FIG. 3A shows an electrical model of a BAW such as an FBAR.
Figure 3B:
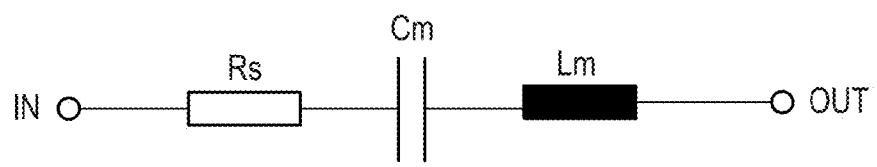
FIG. 3B shows a simplified model of a BAW resonator at series resonance.
Figure 3C:
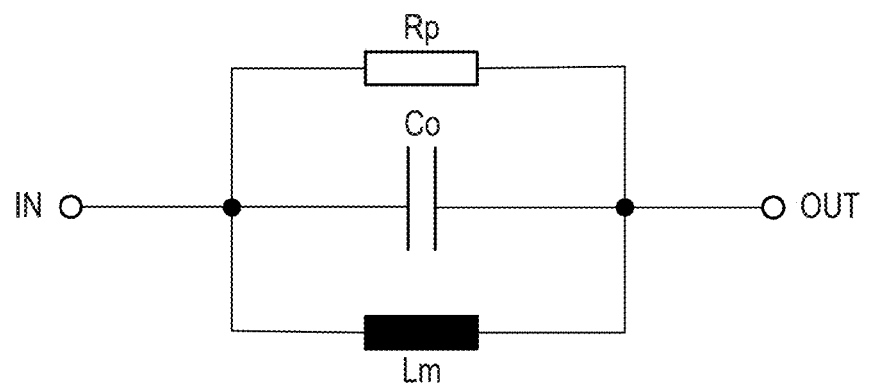
FIG. 3C shows a simplified model of a BAW resonator at parallel resonance.

During typical operation as a part of a ladder filter, for instance, an input electrical signal may be applied to an input terminal of bottom electrode 415 and top electrode 430 may be connected to the output terminal. The input electrical signal typically comprises a time-varying voltage that causes vibration in the active region. This vibration in turn produces an output electrical signal at an output terminal of top electrode 430. The input and output terminals may be connected to bottom and top electrodes 415 and 430 via connection edges that extend away from the active region as shown in FIG. 4. For example, from a top view, these connection edges may be seen to extend outside of an apodized pentagon shape such as that illustrated in FIG. 1B. The input and output terminals of FBAR 400 may be connected to appropriate terminals of other FBARS 400 comprising the ladder filter, for instance.

In the absence of a collar structure and a top planarization layer, the electrically excited piston mode is terminated at the edge of top electrode 430. The top electrode edge presents a significant discontinuity in cutoff frequencies between the active region and the peripheral region outside of the edge of top electrode 430. For instance, in an illustrative simulated example, FBAR 400 vibrates with a cutoff frequency for thickness extensional (TE) mode of about 2 GHz in the active region and with a cutoff frequency for TE mode of about 3.5 GHz in the peripheral region to the left of top electrode 430. This structural discontinuity causes excitation of lateral modes in both the active and peripheral regions (to satisfy continuity of appropriate particle velocity and stress components at the interface between these both regions), leading in turn to undesirable scattering of acoustic energy from the piston mode and the resulting degradation of electrical response of FBAR 400.

Substrate 405 typically comprises a material compatible with semiconductor processes, such as silicon (Si), gallium arsenide (GaAs), indium phosphide (InP), glass, sapphire, alumina, or the like. Trench 410 is formed within substrate 405, and it functions to allow free mechanical vibration of an active region formed by an overlap between bottom electrode 415, top electrode 430, and piezoelectric layer 425 over trench 410. Trench 410 typically comprises an air gap, but it could alternatively comprise an acoustic mirror such as a Bragg mirror, for instance. Examples of various fabrication techniques of cavities in a substrate are described by U.S. Pat. No. 7,345,410 of Grannen et al., filed on Mar. 18, 2008, and various fabrication techniques of acoustic mirrors are described in U.S. Pat. No. 7,358,831 of Larson III, et al., filed Apr. 15, 2008, which are hereby incorporated by reference.

Substrate 405 has a trench 410, which can include an air gap or an acoustic reflector such as a Bragg mirror. The air gap or acoustic reflector is designed to prevent substrate 405 from absorbing mechanical energy from the acoustic stack as it vibrates. In other words, the air gap or acoustic reflector allows the active region of the acoustic stack to vibrate with relative freedom. The air gap is typically formed by depositing a sacrificial layer in trench 410 prior to forming bottom electrode 415, and then removing the sacrificial layer subsequent to forming top electrode 430. Thus, bottom electrode 415 can be suspended above the air gap.

Bottom and top electrodes 415 and 430 are typically formed of an electrically conductive metal such as molybdenum (Mo), tungsten (W), aluminum (Al) or copper (Cu), but other materials may be used in various alternative embodiments. In general, these features can be formed of the same or different materials and with the same or different thicknesses according to various design specifications or tradeoffs. Piezoelectric layer 425 typically comprises a thin film of piezoelectric material such as zinc oxide (ZnO), aluminum nitride (AlN) or lead zirconium titanate (PZT) but other materials may be used in various alternative embodiments.

Planarization layer 420 is typically formed of a planarization material such as non-etchable borosilicate glass (NEBSG). This layer is not strictly required for the functioning of FBAR 400, but its presence can confer various benefits. For instance, the presence of bottom planarization layer 420 tends to improve the structural stability of FBAR 400, it can improve the quality of growth of subsequent layers, and it may allow bottom electrode 415 to be formed without its edges extending beyond trench 410. Further examples of potential benefits of planarization are presented in U.S. patent application Ser. No. 13/286,038 filed Oct. 31, 2011, the subject matter of which is hereby incorporated by reference.

As indicated above, the performance of FBAR 400 can be degraded significantly by discontinuities of cutoff frequencies between the active and peripheral regions. One way to reduce the impedance discontinuities in FBAR 400 is to form a collar structure in the peripheral region to create a more uniform impedance profile for electrically excited purely longitudinal piston mode. The collar structure comprises a dielectric material of predetermined thickness and width that substantially surrounds the active region. The collar structure provides mass loading to lower the cutoff frequency outside the active region. Consequently, it may produce a more uniform lateral cutoff frequency profile across FBAR 400.

Figure 5A:
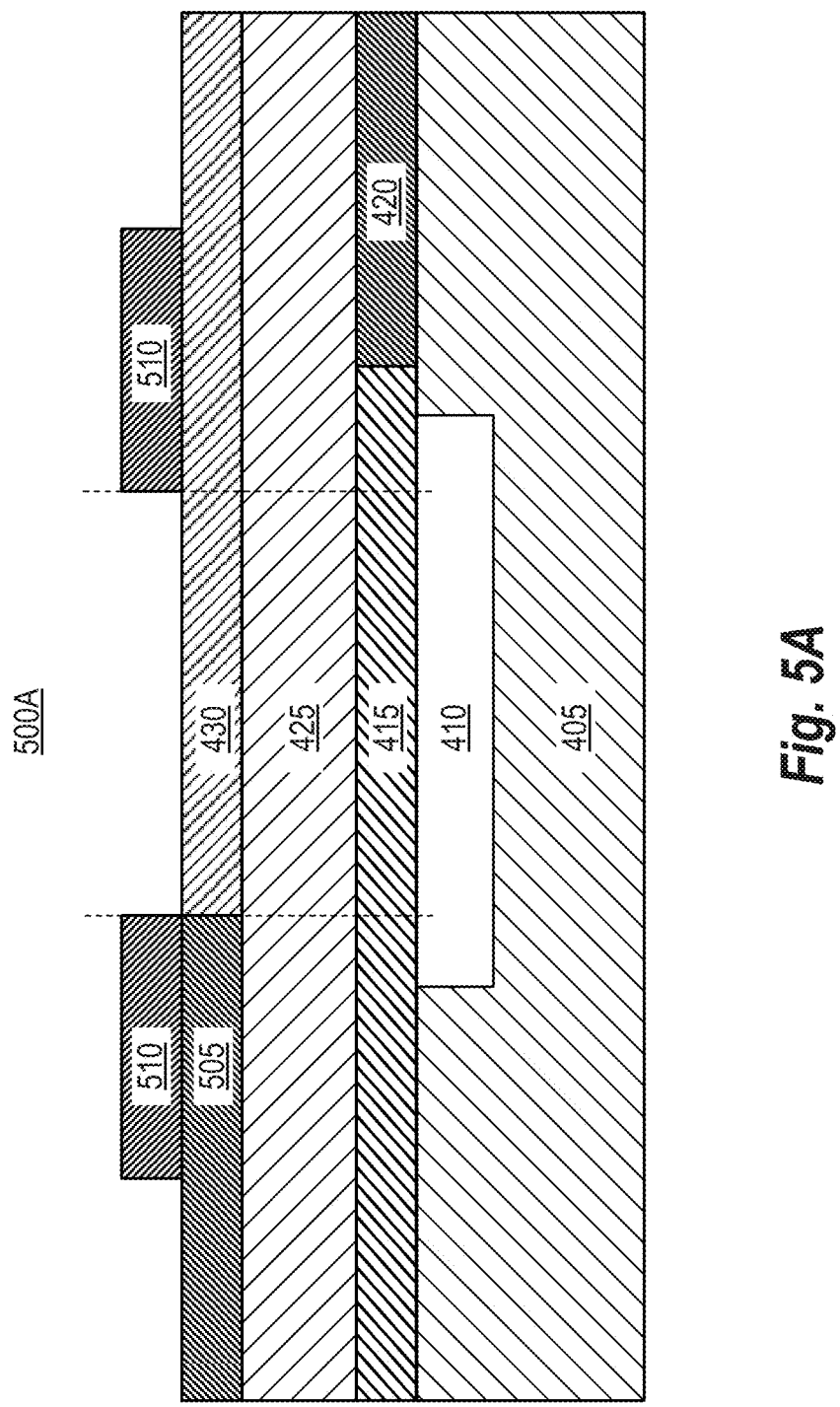
FIG. 5A is a cross-sectional view of an FBAR comprising a collar structure formed on a planarization layer and a top electrode according to a representative embodiment.

FIG. 5A is a cross-sectional view of an FBAR 500A comprising a collar structure according to a representative embodiment.

Referring to FIG. 5A, FBAR 500A is substantially the same as FBAR 400, except that it further comprises a planarization layer 505 and a collar structure 510. Planarization layer 505 is formed on piezoelectric layer 425 adjacent to top electrode 430. Collar structure 510 is formed in a collar region surrounding the active region of FBAR 500A. Although not shown in FIG. 5A, collar structure 510 typically forms a ring around the active region in an anodized shape such as that illustrated in FIG. 1B.

Planarization layer 505 is typically formed of NEBSG or another suitable planarization material. Planarization layer 505 typically has a relatively low acoustic impedance, but it could alternatively be formed of a material having higher acoustic impedance than NEBSG in order to produce a vertical modal energy distribution across the stack in the region of collar structure 510 that matches more closely a vertical modal energy distribution across the stack in the active region, as will be described in relation to FIG. 7 below. Such materials, however, are generally mechanically harder and therefore more difficult to planarize than NEBSG. For example, when planarizing a relatively hard material using a planarization technique such as chemical mechanical polishing (CMP), it may be difficult to remove all surface imperfections, such as so-called "bat ears" on the corners of certain polished features. Accordingly, in some embodiments, planarization layer 505 may be formed of a composite structure having a first layer of relatively hard material with high acoustic impedance, and a second layer of softer material with lower acoustic impedance, as will be described in relation to FIG. 5B. In other embodiments, collar structure 510 may be formed directly on top of piezoelectric layer 425 and on top of top electrode 430, so FBAR 500A may omit planarization layer 505.

Collar structure 510 is formed of a dielectric material, typically one with relatively high acoustic impedance. For example, it may be formed of silicon carbide, silicon nitride, aluminum nitride, aluminum oxide, zinc oxide or diamond. Collar structure 510 can be formed by depositing a thin etch stop layer (e.g., 300 Å of AlN if silicon carbide is used to form a collar) and then depositing a layer of the collar dielectric layer over planarization layer 505 and top electrode 430. Then, dry etching is used to define a desired pattern of collar structure 510. After collar structure 510 is formed, an optional passivation layer may be deposited (not shown in FIG. 5A) and ion-milling may be performed to fine-tune the frequency response of a filter, for instance, comprising one or more FBARs 500A. Of course, various other techniques may be incorporated to form the top collar structure 510, as would be apparent to one of ordinary skill in the art. For example, the order of depositing and forming a layer of collar structure 510 and depositing a passivation layer may be reversed.

Figure 5B:
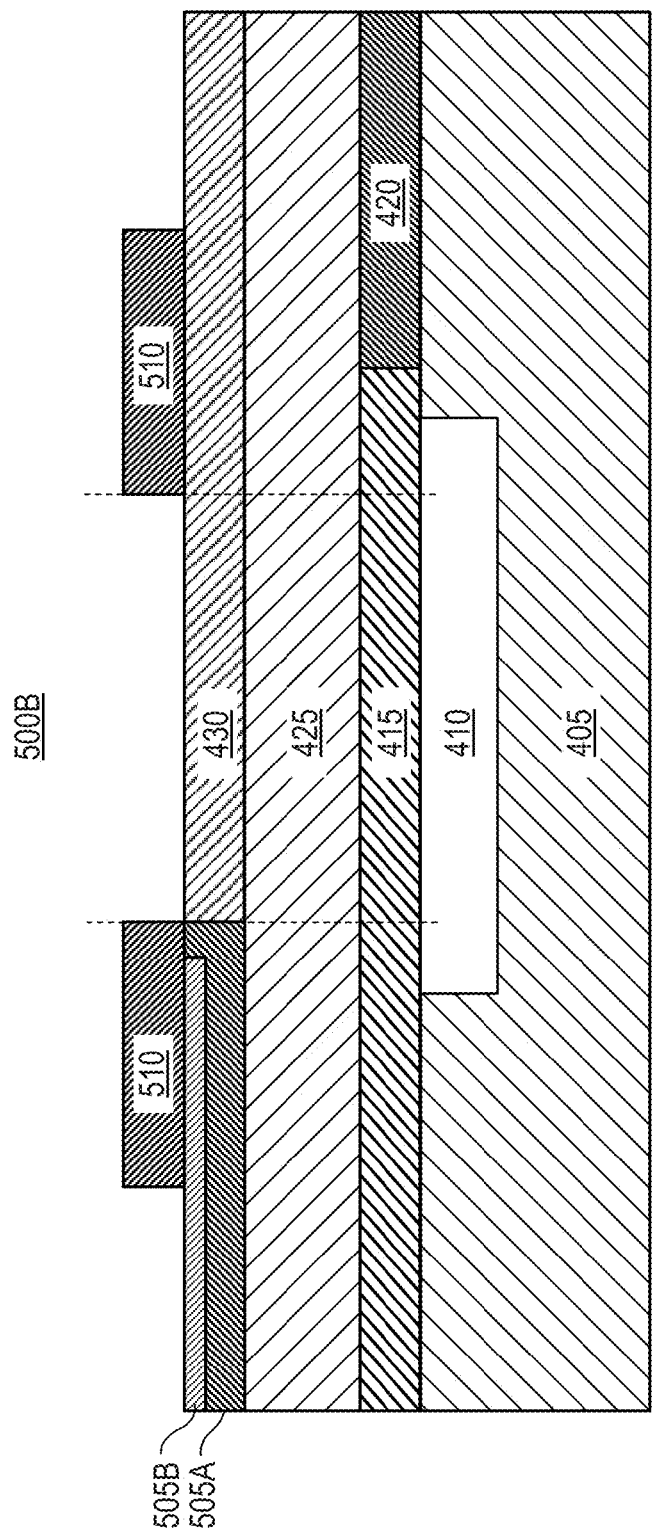
FIG. 5B is a cross-sectional view of an FBAR comprising a collar structure formed on a planarization layer and a top electrode according to another representative embodiment.

FIG. 5B is a cross-sectional view of an FBAR 500B comprising a collar structure according to a representative embodiment. FBAR 500B is substantially the same as FBAR 500A, except that planarization layer 505 is formed with a composite structure.

Referring to FIG. 5B, planarization layer 505 comprises a first layer 505A and a second layer 505B. First layer 505A is formed by depositing a material of high acoustic impedance on piezoelectric layer 425 and top electrode 430 of FBAR 500B. The high acoustic impedance layer may be, for instance, silicon carbide, silicon nitride, aluminum nitride, aluminum oxide, zinc oxide or diamond. Second layer 505B is then formed by depositing a material of lower acoustic impedance on top of first layer 505A followed by the dry etching to remove both materials from the active region of FBAR 500B. Because second layer 505B is formed of a softer material, it can be readily planarized with top electrode 430 using a technique such as CMP. After planarization layer 505 is formed, collar structure 510 is formed as described in relation to FIG. 5A and then passivation layer (not shown) may be deposited.

The use of a high acoustic impedance material in planarization layer 505 tends to produce a vertical modal energy distribution across the stack in the region of collar structure 510 that matches more closely a vertical modal energy distribution across the stack in the active region. This allows a closer match between a vertical distribution of the electrically excited piston mode in the active region and a vertical distribution of an evanescent thickness extensional (eTE) mode in the region of collar structure 510 at the frequencies above the series resonance frequency Fs of FBAR 500B. The eTE mode may then decay exponentially in the direction away from the collar/membrane interface without coupling to other propagating modes supported by the FBAR 500B structure. This in turn may result in overall reduced scattering loss in the collar region and may produce significant improvements in Rp. Moreover, although not shown in FIG. 5A or 5B, the use of higher acoustic impedance materials in collar structure 510 and the passivation layer can also contribute to improved performance for similar reasons.

Figure 6A:
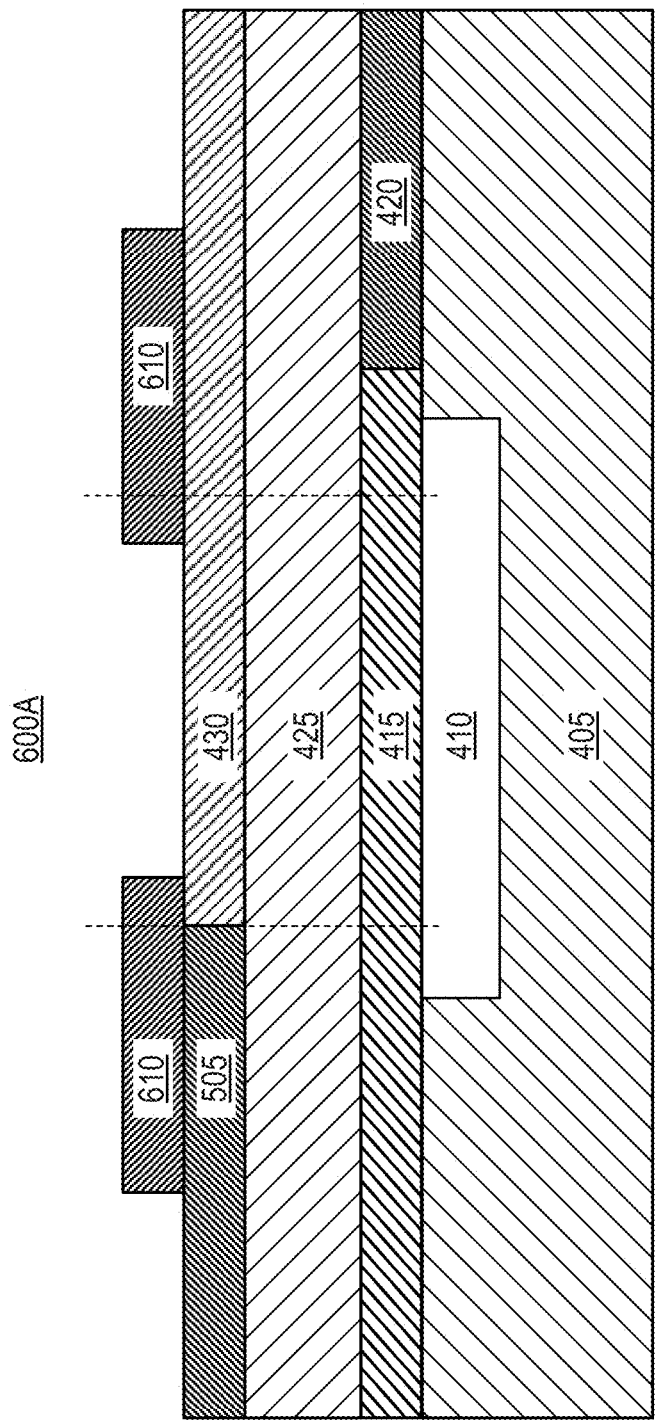
FIG. 6A is a cross-sectional view of an FBAR comprising a collar/frame structure formed on a planarization layer and a top electrode according to a representative embodiment.

FIG. 6A is a cross-sectional view of an FBAR 600A comprising a collar/frame structure formed on a planarization layer and a top electrode according to a representative embodiment.

Referring to FIG. 6A, FBAR 600A is substantially the same as FBAR 500A, except that collar structure 510 is replaced by a collar/frame structure 610. Collar/frame structure 610 differs from collar structure 510 in that it extends over an edge of top electrode 430. This extension is illustrated in FIG. 6A by portions of collar/frame structure 610 within the pair of dotted lines.

A frame typically comprises one or more added (or removed) thin layers of material along a perimeter of a resonator device. It can lower (or increase) the cutoff frequency in a corresponding frame region relative to the main membrane. This in turn reduces the amplitude of the electrically excited piston mode and the resulting scattering at top electrode edges above (or below) the cut-off frequency of a membrane. Frames can also create an acoustic impedance mismatch to enable suppression of the amplitudes of propagating and/or evanescent modes (whichever exist in the frequency range of interest) mechanically excited at the membrane/frame boundary, thus further reducing acoustic energy leakage to the outside of the active region.

In relation to FIG. 6A a frame part (i.e., a part extending over the edge of top electrode 610) of the collar/frame structure will suppress the amplitude of the electrically excited piston mode in the frame portion of collar/frame structure 610 as described above, while the collar part will facilitate exponential decay of mechanically excited at the membrane/collar interface eTE mode in the region of collar 610. Thus a combined collar/frame structure may provide additional suppression of spurious lateral modes, resulting in further improvement of FBAR 600A parallel resistance Rp and Q values. On the other hand, depending on materials forming planarization layer 505 and collar 610, a cutoff frequency shift in the region where collar 610 overlaps the active region of FBAR 600A may provide a source of additional acoustic scattering of the piston mode which may outweigh the benefits of having a combined collar/frame structure. That may be the case, for example, where most of the cutoff frequency shift in the collar 610 region is due to the presence of collar 610 rather than planarization layer 505. Also, this may be the case in embodiments in which planarization layer 505 is skipped and the collar 610 is formed directly on piezoelectric layer 425, for instance. Thus the amount of overlap of collar 610 with the top electrode 430 may be adjusted experimentally for the best performance for a specific materials and stack design used in FBAR 600A.

Figure 6B:
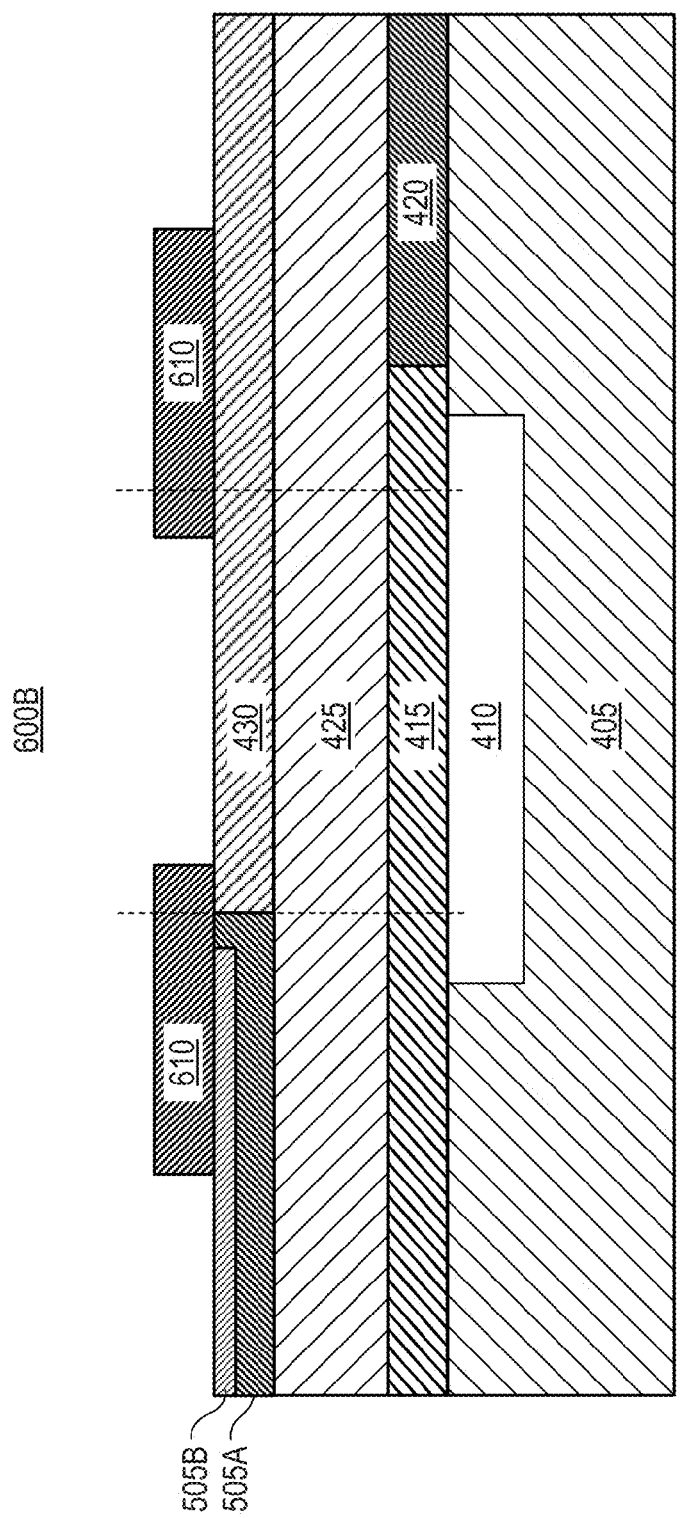
FIG. 6B is a cross-sectional view of an FBAR comprising a collar/frame structure formed on a planarization layer and a top electrode according to another representative embodiment.

FIG. 6B is a cross-sectional view of an FBAR 600B comprising a collar structure according to a representative embodiment. FBAR 600B is substantially the same as FBAR 600A, except that planarization layer 505 is formed with a composite structure.

Referring to FIG. 6B, planarization layer 505 comprises first layer 505A and second layer 505B, as in FIG. 5B. These layers can be formed as described above in relation to FIG. 5B, and they may provide benefits similar to those described above in relation to FIG. 5B.

Figure 7:
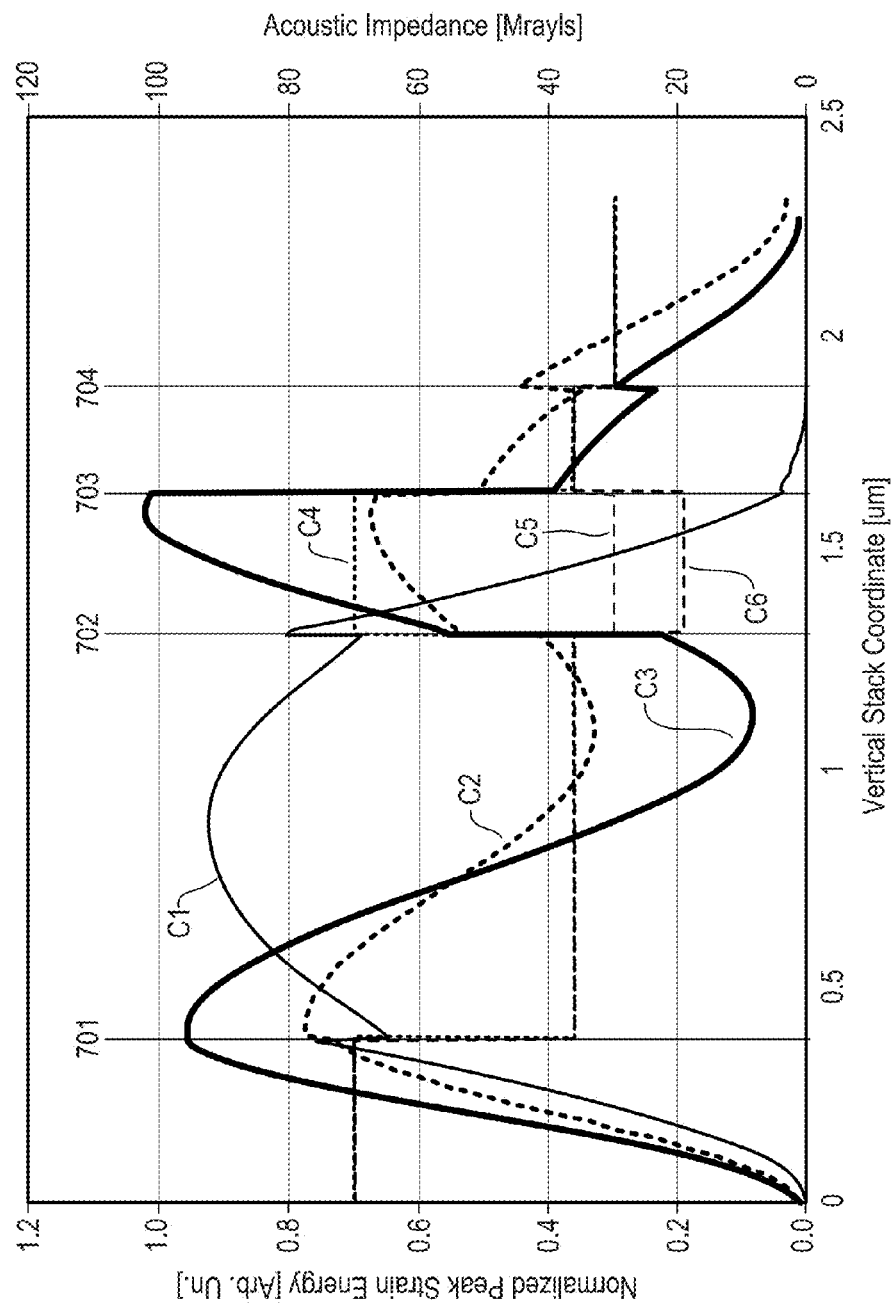
FIG. 7 is a graph illustrating the normalized peak strain energy distributions for selected modes of the FBAR of FIG. 4 compared with two versions of FBAR 500A formed with materials of different acoustic impedances.

FIG. 7 is a graph illustrating modal distributions and acoustic impedances in a vertical direction of FBAR 400 compared with two versions of FBAR 500A comprising planarization layers formed with materials of different acoustic impedances. More particularly, the graph illustrates normalized peak strain energy distributions across the stack at a frequency above the series resonance frequency of FBAR 400 and FBAR 500A. This graph illustrates the impact of acoustic impedance of planarization layer used in formation of collar structure 510 on modal overlap of electrically excited piston mode in the membrane region with mechanically excited evanescent modes in the region of collar structure 510.

The graph of FIG. 7 plots normalized peak strain energy (NPSE) distributions in different layers comprising FBAR 400 and FBAR 500A. To distinguish each layer, its acoustic impedance (Za) is also shown in FIG. 7. Illustratively, bottom and top electrodes 415 and 430 are formed of approximately 3800 Å and 3300 Å of molybdenum, respectively, and piezoelectric layer 425 is formed of approximately 9300 Å of AlN. In addition, passivation layer (not shown in FIG. 4) is formed of approximately 2400 Å of AlN. Collar structure 510 is formed of approximately 3800 Å of SiC for planarization layer of FBAR 500 formed of NEBSG or of approximately 4250 Å of SiC for planarization layer of FBAR 500A formed of SiC. The normalized peak strain energy distribution is represented on the y-axis on the left side, and acoustic impedance of each layer is represented on the y-axis on the right side.

In FIG. 7, each layer in FBAR 400 and FBAR 500A is indicated by fixed acoustic impedance of that layer. The boundaries between different layers are indicated by vertical lines 701-704. The bottom of each stack is located at a Vertical Stack Coordinate (horizontal axis) equal to 0. Line 701 separates bottom electrode 415 from piezoelectric layer 425 in FBAR 400 and FBAR 500A. Line 702 separates piezoelectric layer 425 from top electrode 430 in FBAR 400. However, in the region of collar structure 510 in FBAR 500A, line 702 separates piezoelectric layer 425 from planarization layer 505. Line 703 separates top electrode 430 from the passivation layer (not shown is FIGS. 4-5) in FBAR 400. In the region of collar structure 510 in FBAR 500A, line 703 separates planarization layer 505 from the passivation layer. Line 704 indicates the top of FBAR 400 at the passivation/air interface. In the region of collar structure 510 in FBAR 500A, line 704 separates passivation layer from collar structure 510. The collar/air interface in FBAR 500A is indicated by the point where NPSE and Za distributions end (at approximately 2.3 μm on a horizontal axis).

A first set of curves C1 and C4 corresponds to FBAR 400 of FIG. 4 ("the first FBAR"). Curve C1 illustrates the NPSE of the electrically excited piston mode in the active part of FBAR 400. The simulated Rp value of this device is about 1300 Ohms. Because active parts of FBAR 400 and 500A are essentially identical, curve C1 also illustrates the NPSE of the electrically excited piston mode in the active part of FBAR 500A. Curve C4 illustrates acoustic impedance Za of each layer comprising the active parts of FBAR 400 and FBAR 500A.

A second set of curves C2 and C5 corresponds to NPSE distribution and Za, respectively, of FBAR 500A in which top planarization layer 505 and collar structure 510 are formed of sputtered silicon carbide (SiC) and an intervening passivation layer is formed of AlN ("the second FBAR"). As indicated above, the collar thickness is about 4250 Å, and the FBAR device has a simulated Rp value of about 3700 Ohms for optimized width of collar structure 510.

A third set of curves C3 and C6 corresponds to NPSE distribution and Za FBAR 500A in which top planarization layer 505 is formed of NEBSG, the passivation layer is formed of ALN, and collar structure 510 is formed of sputtered SiC ("the third FBAR"). As indicated above, the collar thickness is about 3800 Å, and the FBAR device has a simulated Rp value of about 1950 Ohms for optimized width of collar structure 510.

As illustrated by curve C1, the electrically excited piston mode in active part of FBAR 500A has a very symmetric distribution across the stack with peak energy located in the middle of AlN layer. Not illustrated in FIG. 7 is the fact that piston mode corresponds to purely longitudinal motion, meaning that the only non-zero stress and displacement components occur along the horizontal coordinate in FIG. 7 (which is vertical coordinate for FBAR 500A). At an interface between the active part of FBAR 500A and collar structure 510 all lateral modes (that is propagating, evanescent and higher-order complex modes) are being excited by structural and electric-field discontinuities. Propagating modes can carry energy away from the active part of FBAR 500A, leading to undesirable Q-factor and Rp degradation. However, as indicated above, evanescent and complex modes decay exponentially from the point of excitation, thus for wide enough collar evanescent and complex modes may not result in any significant acoustic energy loss to the surroundings of FBAR 500A, such as substrate 405. Thus maximization of evanescent and complex modes excitation and minimization of propagating modes excitation in the region of collar structure 510 may beneficially increase Q-factor and Rp of FBAR 500A.

In general, improving match of modal distributions between exciting and specific excited modes (for instance, evanescent TE mode) results in increased excitation of these specific excited modes. As illustrated by curves C2 and C3, the NPSE distribution in evanescent TE mode for second FBAR 500A (curve C2) more closely resembles NPSE distribution for piston mode than NPSE distribution in evanescent TE mode for third FBAR 500A (curve C3). Thus, the second FBAR 500A (curve C2) has approximately two times higher Rp than the third FBAR 500A (curve C3). It should be pointed out, however, that a more rigorous analysis of modal mechanical excitation process requires calculation of overlap integrals between appropriate stress and particle velocity components on both sides of membrane/collar interface, so comparison of NPSE distributions in FIG. 7 may be viewed as merely illustrative.

The first FBAR does not support evanescent modes in the region beyond the top electrode 430 for frequency range of the pass-band of FBAR 400. Therefore significant amount of energy from the piston mode (curve C1) may be transferred to propagating modes supported by the stack comprising of bottom electrode 415 and piezoelectric layer 425, illustratively shown on the left side of line 702 in FIG. 7, resulting in low Rp and Q-factor values. Thus the second and third FBARs both have improved Rp compared to FBAR 400 as a result of collars supporting evanescent TE modes in the pass-band frequency range of FBAR 500A. Thus, the inclusion of collar structure 510 tends to have a positive impact on device performance.

Although the NPSE distribution of the eTE mode in the region of collar structure 510 of the second FBAR still differs significantly from NPSE distribution of the piston mode in the active region, the second FBAR has a significantly higher Rp value than the first FBAR (approximately three times larger). Also, the considerably higher Rp value of the second FBAR than the third FBAR can be attributed, at least in part, to the fact that the SiC forming the planarization layer has greater acoustic impedance than NEBSG. This difference in acoustic impedances is illustrated by a difference between curves C5 and C6 in the planarization layer region, that is a region between vertical lines 702 and 703 in FIG. 7. Accordingly, all other things being equal, it may be beneficial to form these features using materials of higher acoustic impedance. Thus structures comprising composite planarization layers described in relation to FIG. 5B may offer beneficial tradeoffs in terms of process complexity and improved performance of FBAR 500B devices.

Figure 8:
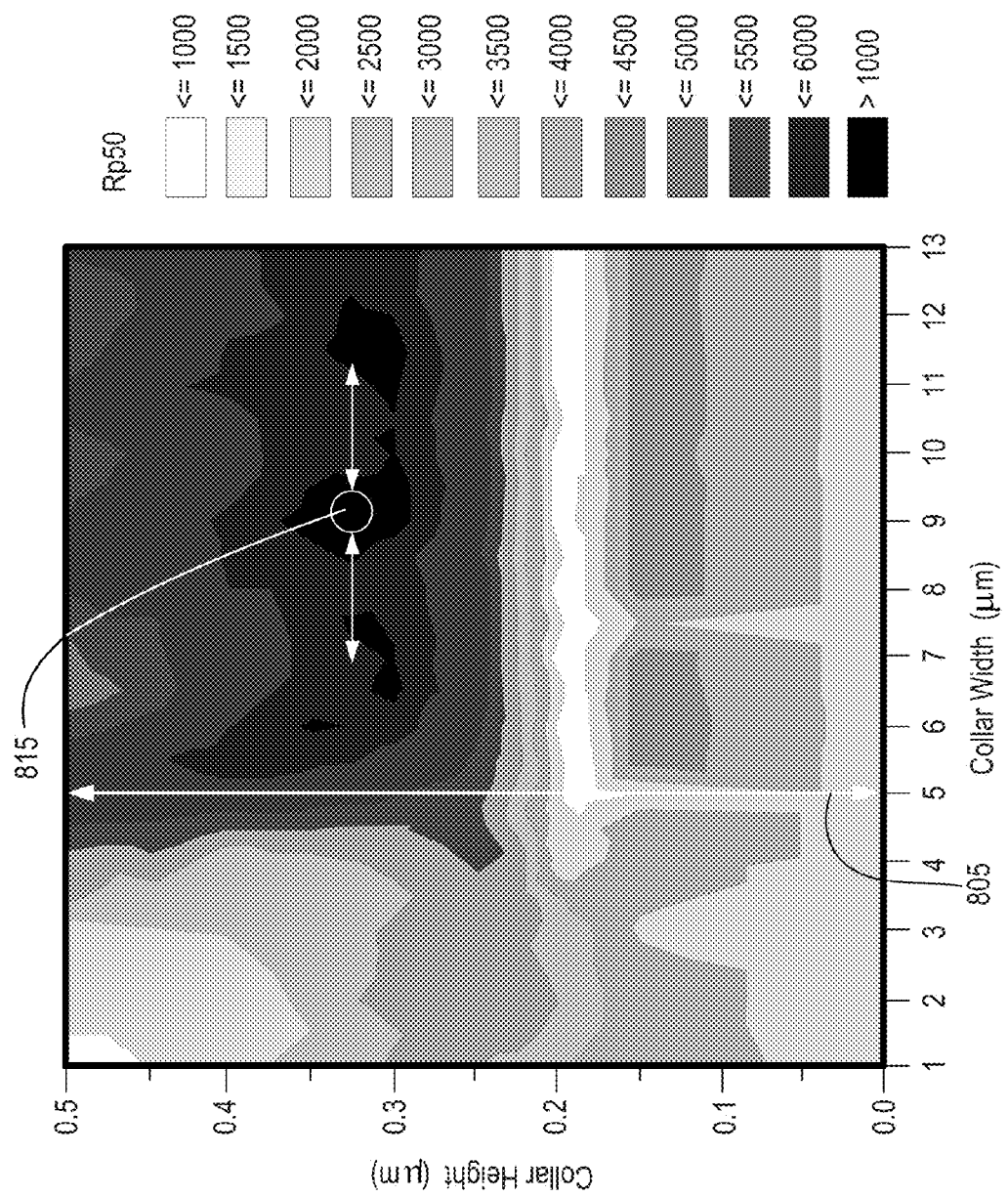
FIG. 8 is a contour plot illustrating the parallel resistance Rp of the FBAR of FIG. 5A as a function of the width and height of the collar structure.

FIG. 8 is a contour plot illustrating the simulated parallel resistance Rp of FBAR 500A as a function of the width and height of collar structure 510. In the example of FIG. 8, bottom and top electrodes 415 and 430 are formed of approximately 3000 Å and 2500 Å thick molybdenum, respectively, piezoelectric layer 525 is formed of 11500 thick aluminum nitride, planarization 505 layer is formed of approximately 2500 Å NEBSG, passivation layer is formed of approximately 2400 Å thick aluminum nitride and collar structure 510 is formed of aluminum nitride. In FIG. 8, the width and height of collar structure 510 are plotted on the x-axis and y-axis, respectively. The width was swept across a range of 1 μm to 13 μm while maintaining alignment between the respective right edges of top electrode 430 and collar structure 510.

Referring to FIG. 8, a vertical line 805 at about 5 μm indicates a width of collar structure 510 where it reaches the edge of trench 410. Beyond this line (that is for values on horizontal axis larger than 5 μm), collar structure 510 extends over substrate 405.

A circle 815 indicates the maximum value of Rp, and horizontal arrows extending from the circle indicate other local maxima located nearby. The position of these local maxima indicates that Rp may be a periodic function of the width of collar structure 510, with a period of about 2.5 μm. In the region of circle 815, FBAR 500A exhibits an Rp value of about 5300 Ohms and a $Kt^2$ value of about 5.95%. By comparison, FBAR 400, which lacks collar structure 510, exhibits an Rp value of about 1300 Ohms and a $Kt^2$ value of about 5.87%. Accordingly, collar structure of appropriate width and height can produce a significantly improved Rp without diminishing $Kt^2$. The specific dependence of Rp on the height and width of collar structure 510 may depend on actual stack thicknesses and materials used for FBAR 500A, as well as the design parameters of planarization layer 505 and collar structure 510. It should be pointed out that in the illustrative example shown in FIG. 8 maximum Rp value occurs for collar thickness of approximately 3000 Å, with thinner collars exhibiting significantly lower Rp values. For these thiner collars the cutoff frequency in the collar region 510 is significantly higher than the series resonance frequency of the active part of FBAR 500A, resulting in significant excitation of propagating modes that may detrimentally lower Rp. On the other hand, for collars thicker than 3000 Å the Rp degradation with increasing thickness of the collar 510 is relatively minor. This may be because thicker than 3000 Å collar 510 supports an evanescent TE mode for frequencies above the series resonance frequency of active part of FBAR 500A which may effectively couple to the electrically excited piston mode in the active part of FBAR 500A. As mentioned above, once the piston mode couples effectively to the evanescent TE mode in the collar 510 region, acoustic loss may be limited, which may result in increased Q-factor and Rp values.

Figure 9:
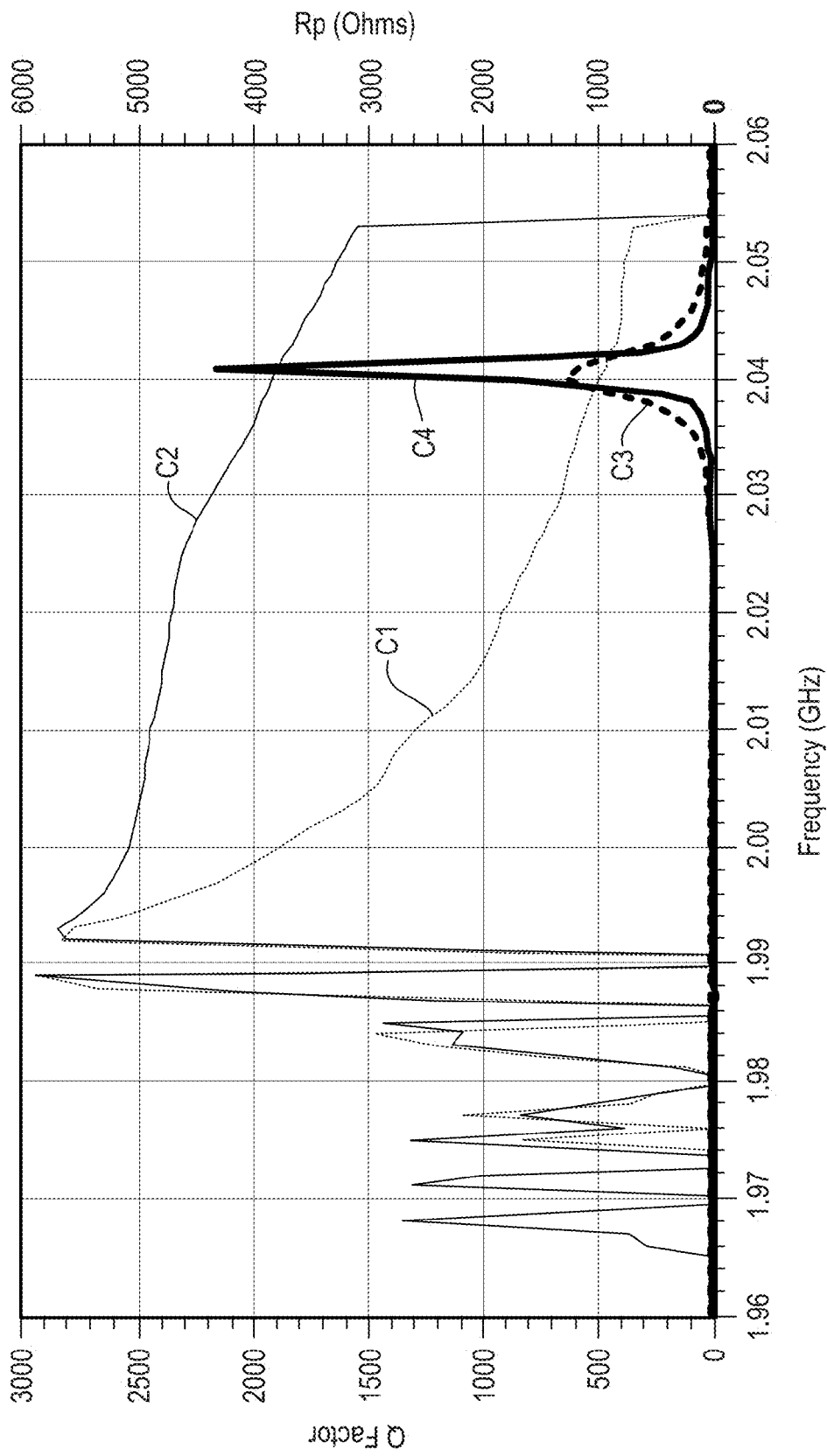
FIG. 9 is a graph illustrating the quality factor (Q-factor) and parallel resistance Rp of the respective FBARs of FIGS. 4 and 5A.

FIG. 9 is a graph illustrating the simulated Q-factor and parallel resistance Rp of the respective FBARs of FIGS. 4 and 5A. In the example of FIG. 9, FBAR 500A is formed with collar structure 510 having a thickness of approximately 3000 Å and a width of approximately 9 μm. These dimensions correspond roughly to the region of circle 815 in FIG. 8.

Referring to FIG. 9, Q-factor is represented by a y-axis on the left side, and Rp is represented by a y-axis on the right side. The values of the Q-factor and Rp are shown as a function of input signal frequency.

A first curve C1 illustrates the Q-factor of FBAR 400, and a second curve C2 illustrates the Q-factor of FBAR 500A. A third curve C3 illustrates the Rp value of FBAR 400, and a fourth curve C4 illustrates the Rp value of FBAR 500A.

A peak value of the Q-factor occurs for each of the devices at about 1.989 GHz. This frequency corresponds to the series resonance frequency Fs of the respective devices. Similarly, a peak value of Rp occurs for each of the two devices at about 2.041 GHz. This frequency corresponds to the parallel resonance frequency Fp of the respective devices. The bandwidth of these devices corresponds to the range of frequencies between their respective values of Fs and Fp. Accordingly, in this example, the two devices have similar bandwidths.

As illustrated by a double headed arrow, at frequencies above Fs, FBAR 500A has significantly higher Q-factor than FBAR 400. In addition, as illustrated by the respective peaks of third and fourth curves C3 and C4, FBAR 500A has a significantly higher Rp value than FBAR 400. In particular, FBAR 500A has an Rp value of about 4400 Ohms while FBAR 400 has an Rp value of about 1300 Ohms. As should be appreciated by one of ordinary skill in the art, Rp of FBAR 500A increased by approximately three times without any significant degradation of the bandwidth when compared to FBAR 400.

Figure 10:
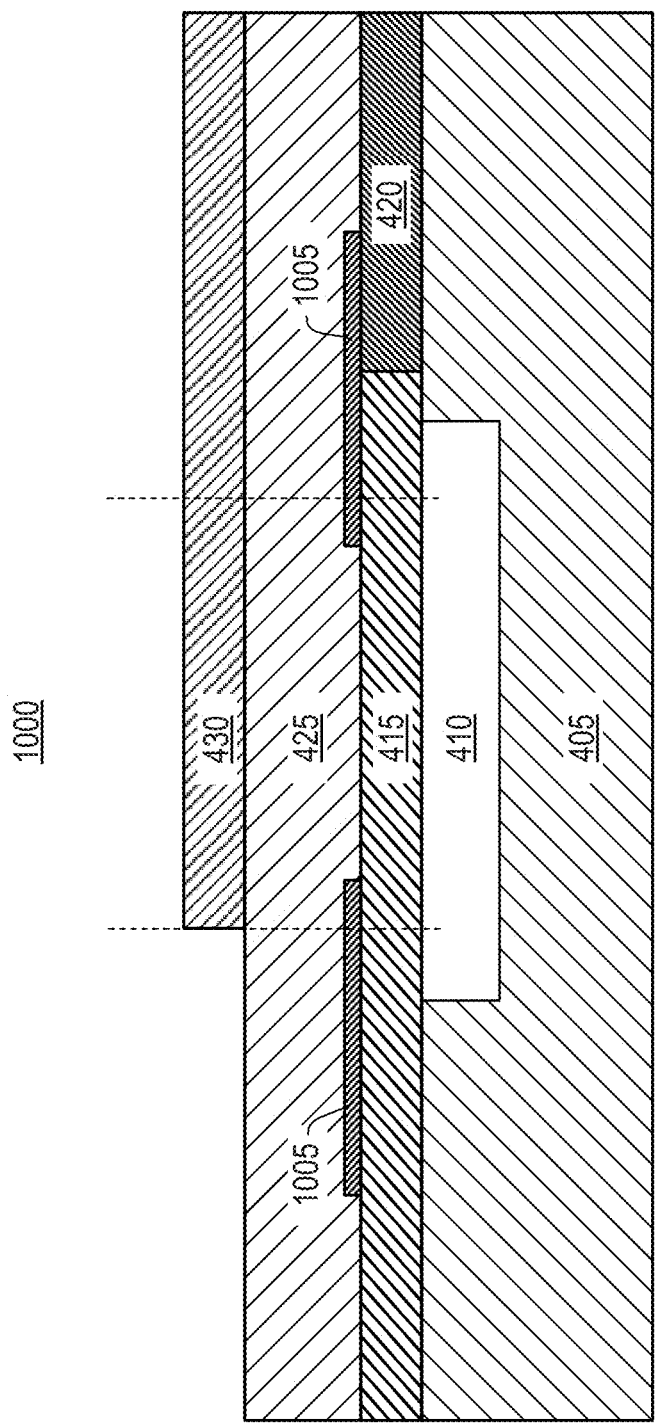
FIG. 10 is a cross-sectional view of an FBAR comprising a collar/frame structure formed under a piezoelectric layer according to a representative embodiment.

FIG. 10 is a cross-sectional view of an FBAR 1000 comprising a collar/frame structure formed under piezoelectric layer 425 according to a representative embodiment.

Referring to FIG. 10, FBAR 1000 is similar to FBAR 400, except that a collar/frame structure 1005 is formed between piezoelectric layer 425 and a top surface of planarization layer 420 and bottom electrode 415. The thickness of collar/frame structure 1005 is adjusted such that respective cutoff frequencies in the active region and the collar region are substantially matched for the same reasons as described in relation to FIGS. 5A and 7.

Collar/frame structure 1005 extends into a region below the outer edges of top electrode 430 (i.e., into the active region). This extended part constitutes a frame portion of the combined collar/frame structure, and a remaining part constitutes a collar portion.

Collar/frame structure 1005 is typically formed by a relatively thin layer of carbon doped silicon oxide (CDO), although other materials may be used in various alternative embodiments. The use of a relatively thin layer, as opposed to a thicker layer, tends to improve the quality piezoelectric layer 425 grown over it. The use of a relatively low acoustic impedance material such as CDO allows the structure to achieve a relatively large frequency shift for relatively small thicknesses of the collar/frame layer. Typically, collar/frame 1005 layer is deposited following deposition and formation of bottom electrode 415 and planarization 420 layers. Dry etch is used to form a desired pattern of collar/frame 1005 region followed by deposition of piezoelectric layer 425.

Figure 11:
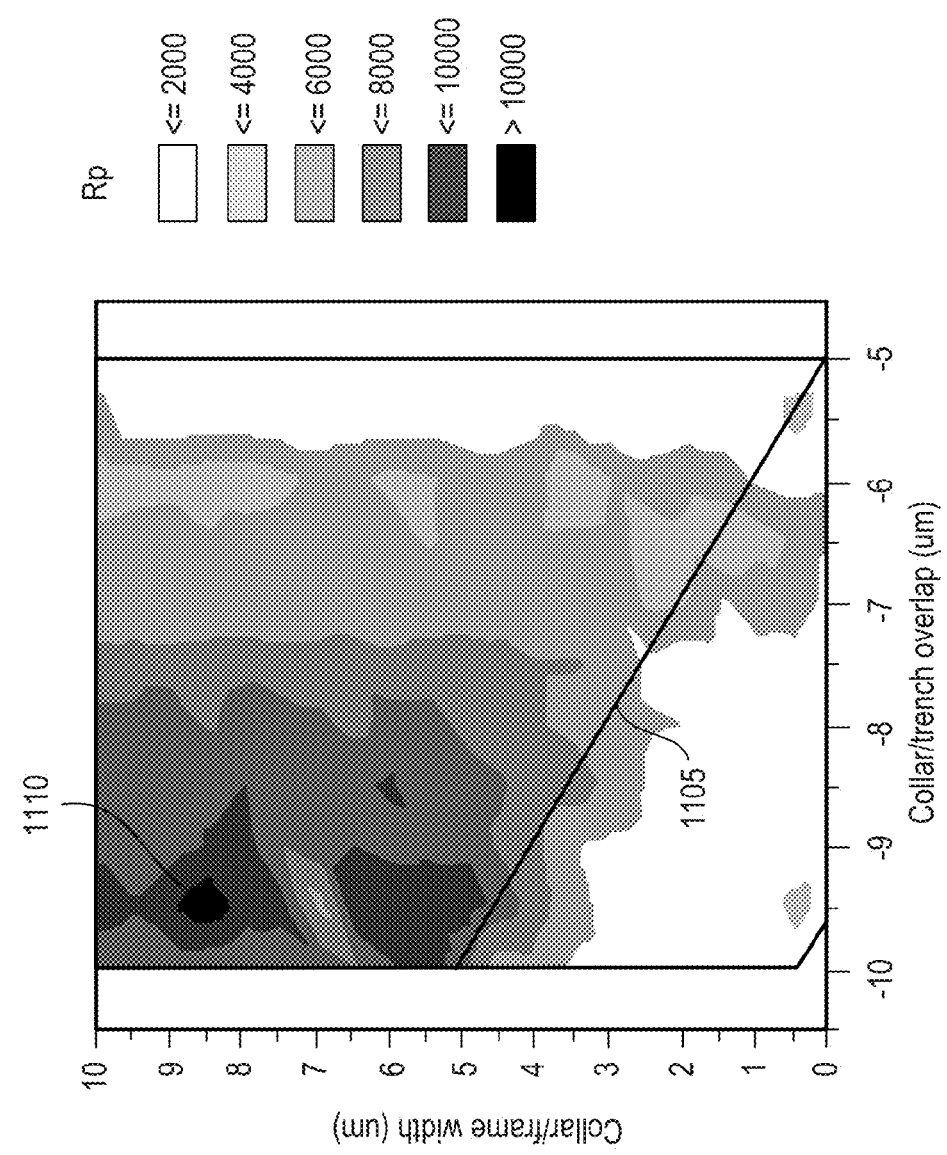
FIG. 11 is a contour plot illustrating the parallel resistance Rp of the FBAR of FIG. 10 as a function of the width of the collar/frame structure and an overlap between the collar/frame structure and a trench.

FIG. 11 is a contour plot illustrating the simulated parallel resistance Rp of FBAR 1000 as a function of the width of collar/frame structure 1005 and an overlap between collar/frame structure 1005 and trench 410. Bottom electrode 415, piezoelectric layer 425 and top electrode 430 are formed of the same materials with the same thickness as described in relation to FBAR 5A of FIG. 8. There is no planarization 505 and passivation layer in the illustrative embodiment described in relation to FIG. 11.

In the example of FIG. 11, collar/frame structure 1005 has a thickness of approximately 400 Å. This thickness is designed to match the cutoff frequencies in the collar region with the cutoff frequency of the active area of FBAR 1000. The edge of top electrode 430 is located at a distance of −5 μm from the side of trench 410. The Rp values were generated by sweeping the width of collar/frame structure 1005 from 0 to 10 μm, as shown on the y-axis, and sweeping the overlap between collar/frame structure 1005 and trench 410 between −10 to −5, as shown on the x-axis. The negative values shown on the x-axis indicate the distance between an inner edge of collar/frame structure 1005 and the edge of trench 410. Thus, for example, a value of −10 μm indicates that the inner edge of collar/frame 1005 structure is within trench 410 by a distance of 10 μm and at the same time the inner edge of collar/frame 1005 structure overlaps the top electrode 430 by a distance of 5 μm.

Because the edge of top electrode 430 is located at a distance of 5 μm from the side of trench 410, narrower versions of collar/frame structure 1005 (e.g., those that are less than 5 μm wide) do not necessarily extend under top electrode 430 forming a frame, or do not necessarily extend beyond the edge of electrode 430 forming a collar structure. Line 1105 in the contour plot of FIG. 11 distinguishes frame-only designs, i.e., those in which collar/frame 1005 extends under the top electrode 430 layer but with outer edges aligned with the edge of top electrode 430. Designs below line 1005 are fully confined under the top electrode 430. Designs above line 1005 are true collar/frame designs.

In FIG. 11, a maximum value of Rp occurs at a point labeled 1110. At this point, Rp is about 11500 Ohms and $Kt^2$ is about 6%. By comparison, the same device without collar/frame structure 1005 has Rp of about 1000 Ohms and $Kt^2$ of about 6%. Accordingly, the use of collar/frame 1005 can produce an improvement in Rp of about eleven times with minimal impact on $Kt^2$. However, as indicated by relatively low Rp values below line 1105, omission of the collar portion from collar/frame structure 1005 may produce relatively poor performance. Also, as indicated by values for collar/trench overlap equal to −5 μm (that is collar/frame 1005 inner edge is aligned with top electrode 430 edge) omission of the frame portion from collar/frame structure 1005 may also produce relatively poor performance.

Although FIG. 11 indicates that the frame portion produces improved Rp in one example of FBAR 1000A, the specific dependence of Rp on collar/frame 1005 width and overlap with trench 410 may depend on actual stack thicknesses and materials used for FBAR 1000A and collar/frame 1005 designs. Accordingly, for different stack designs, operating frequency ranges and/or selected materials, a collar-only configuration may provide sufficient benefits for improved performance of FBAR 1000A.

Figure 12:
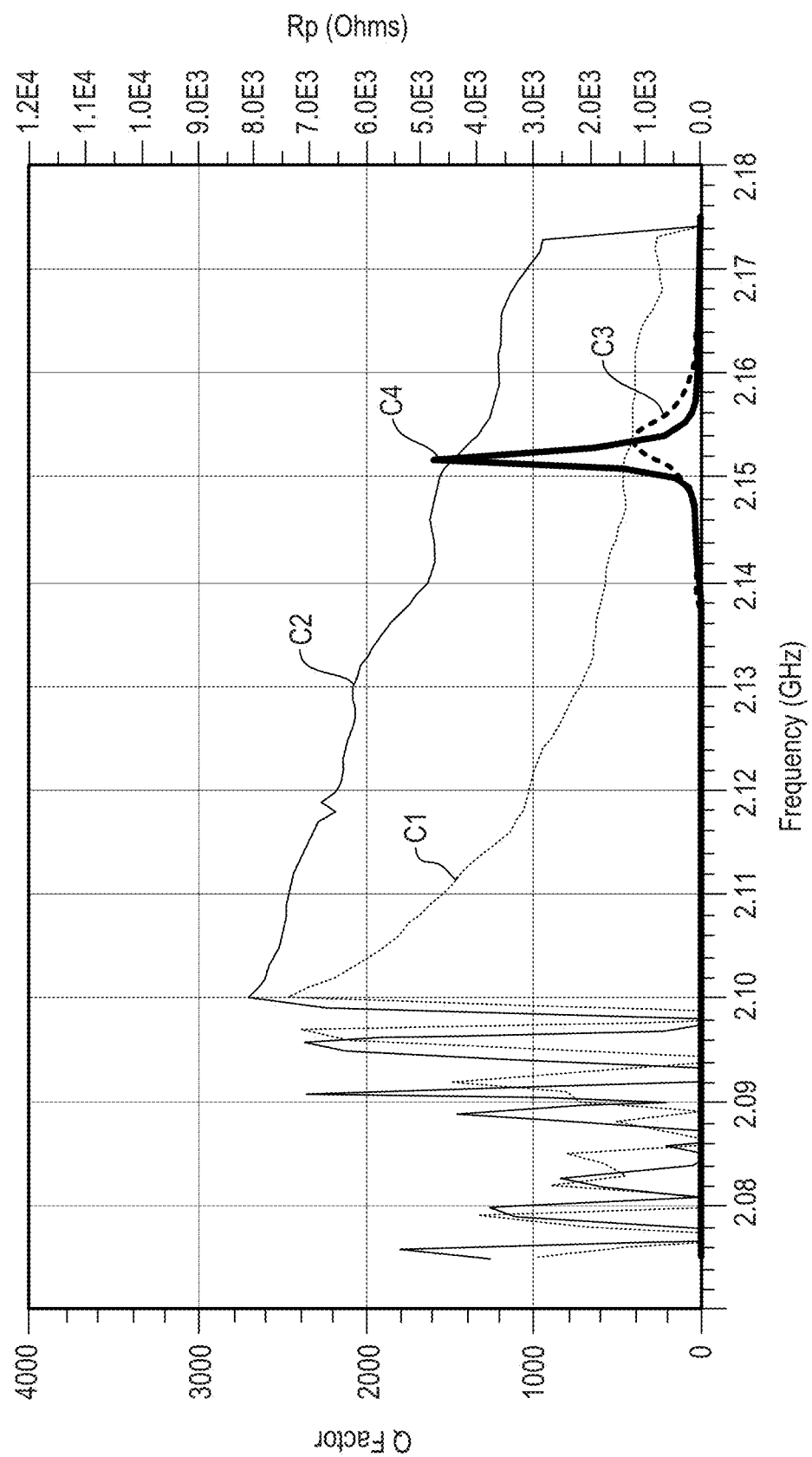
FIGS. 12 and 13 are graphs illustrating the Q-factor and parallel resistance Rp of the respective FBARs of FIGS. 4 and 10.
Figure 13:
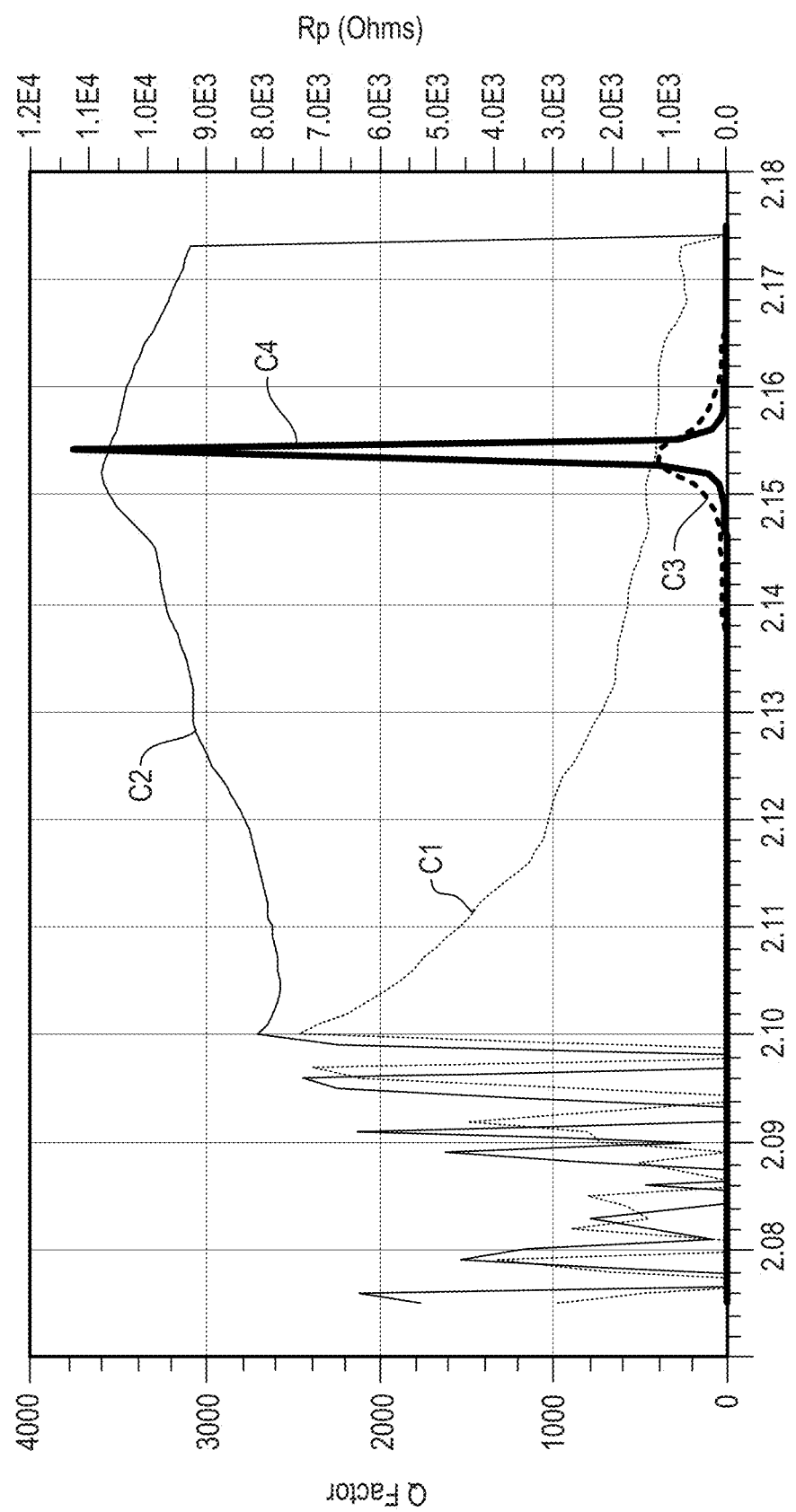

FIGS. 12 and 13 are graphs illustrating the simulated Q-factor and parallel resistance Rp of the respective FBARs 400 and 1000 of FIGS. 4 and 10.

In the respective examples of FIGS. 12 and 13, FBAR 1000 comprises collar/frame structure 1005 formed of CDO and having a thickness of 400 Å. In both examples, collar/frame structure 1005 extends into trench 410 by 9.5 μm and therefore it overlaps with top electrode 430 by 4.5 μm. In the example of FIG. 12, collar/frame structure has a width of 4 μm so it is essentially a frame-only design, and in the example of FIG. 13, collar/frame structure 1005 has a width of 8.5 μm so it is a true frame/collar design and corresponds to the design with highest Rp value simulated in FIG. 11. In both examples, FBAR 400 has the same dimensions as FBAR 1000, but it lacks collar/frame structure 1005.

In each of FIGS. 12 and 13, Q-factor is represented by a y-axis on the left side, and Rp is represented by a y-axis on the right side. The values of the Q-factor and Rp are shown as a function of input signal frequency. Also in both FIGS. 12 and 13, a first curve C1 illustrates the Q-factor of FBAR 400, a second curve C2 illustrates the Q-factor of FBAR 1000, a third curve C3 illustrates the Rp value of FBAR 400, and a fourth curve C4 illustrates the Rp value of FBAR 1000.

In FIG. 12, a peak value of the Q-factor occurs for each of the devices at about 2.1 GHz which represents the series resonance frequency Fs for both devices. A peak value of Rp occurs for FBAR 400 at about 2.154 GHz and for FBAR 1000 at about 2.152 GHz, which represent parallel resonant frequencies Fp for each device, respectively. At frequencies above Fs, FBAR 1000 has significantly higher Q-factor than FBAR 400. In addition, as illustrated by the respective peaks of third and fourth curves C3 and C4, FBAR 1000 has a significantly higher Rp value than FBAR 400. In particular, FBAR 1000 has an Rp value of about 4500 Ohms while FBAR 400 has an Rp value of about 1000 Ohms.

In FIG. 13, the first peak value of the Q-factor occurs for each of the devices at about 2.1 GHz which represents the series resonance frequency Fs for both devices. A peak value of Rp occurs for both devices at about 2.154 GHz which represents the parallel resonance frequency Fp for both devices. At frequencies above Fs, FBAR 1000 has significantly higher Q-factor than FBAR 400. In addition, as illustrated by the respective peaks of third and fourth curves C3 and C4, FBAR 1000 has a significantly higher Rp value than FBAR 400. In particular, FBAR 1000 has an Rp value of about 115000 Ohms while FBAR 400 has an Rp value of about 1000 Ohms.

As illustrated by FIGS. 12 and 13, the use of collar/frame structure 1005 can significantly improve both the Rp and Q-factor of an FBAR. In addition, extending the width of collar/frame structure 1005 from 4 μm to 8.5 μm (or, in other words, extending frame-only structure to collar/frame structure) may produce a large improvement in the Rp value of FBAR 1000. It should be pointed out that $Kt^2$ of the FBAR 1000 of FIG. 12 is slightly lower than that of FBAR 400 as is generally the case for designs using frames. Frames tend to reduce $Kt^2$ because they reduce an overlap between driving electric field and mechanical motion of the piston mode—this is because piston mode amplitude is lowered by the frame structure, as mentioned above. At the same time $Kt^2$ of the FBAR 1000 of FIG. 13 is about the same as that of FBAR 400, about ~6%, indicating that properly designed collar is able to compensate for frame-related degradation of $Kt^2$ values.

Figure 14:
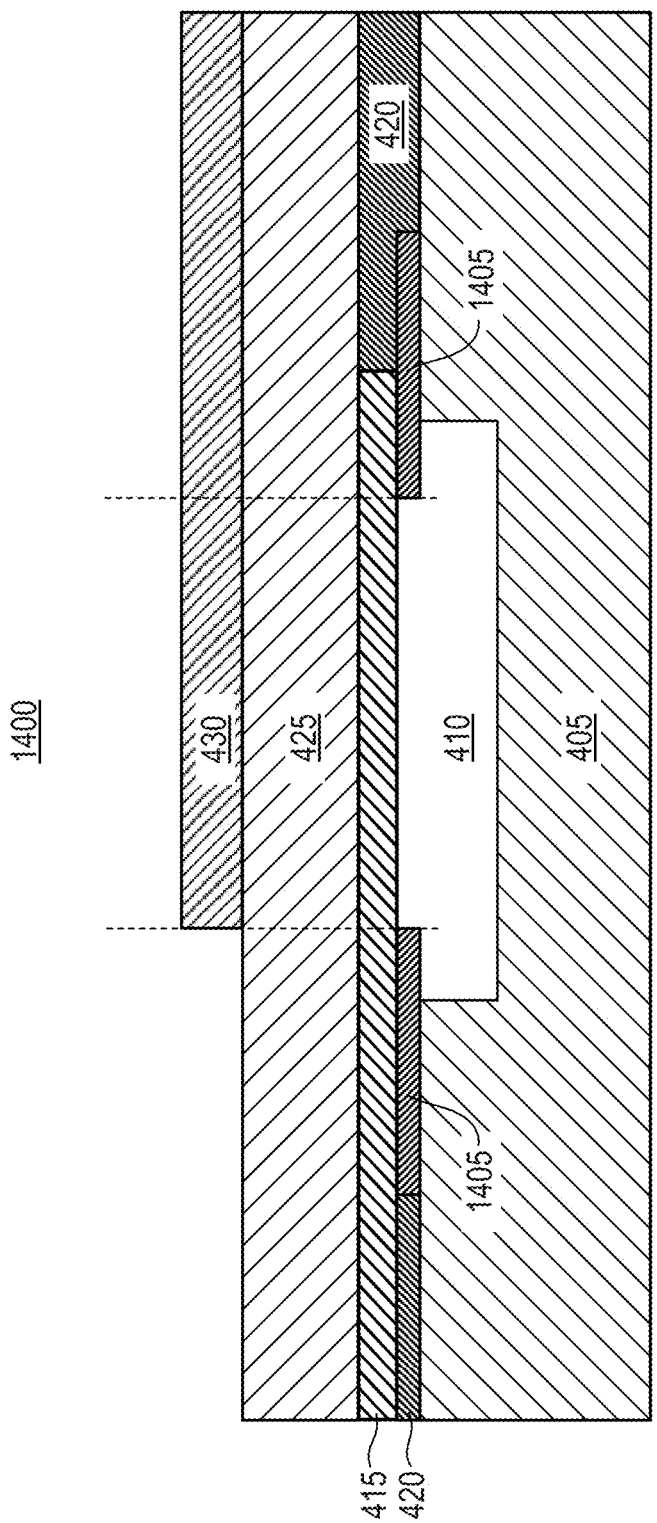
FIG. 14 is a cross-sectional view of an FBAR comprising a collar structure formed between a bottom electrode and a substrate according to a representative embodiment.

FIG. 14 is a cross-sectional view of an FBAR 1400 comprising a collar structure formed between a bottom electrode and a substrate according to a representative embodiment.

Referring to FIG. 14, FBAR 1400 is similar to FBAR 400, except that a collar structure 1405 is formed between substrate 405 and a bottom surface of planarization layer 420 and bottom electrode 415. In addition, part of planarization layer 420 is formed below bottom electrode 415 adjacent to collar structure 1405. Similar to other embodiments described above, the width and thickness of collar structure 1405 can be adjusted such that cutoff frequencies and appropriate mode profiles in the active region and the collar region essentially match, as described in details in relation to FIGS. 5A, 5B and 7. The process of forming collar 1405 is substantially the same as process of forming trench 410. After trench 410 is filled with sacrificial material, a layer for collar structure 1405 is deposited, followed by a dry etch to form a desired opening in the central part of FBAR 1400. The sacrificial material is deposited in the central part of FBAR 1400, followed by CMP planarization. The outer edges of collar layer 1405 are then patterned and etched. An etch stop layer of 300 Å AlN, for example, is then deposited followed by as layer of planarization material. The material is etched off of the collar and central part of FBAR 1400 followed by CMP planarization and deposition of bottom electrode 415. The bottom electrode is patterned followed by deposition and patterning and CMP of an additional layer of planarization material which is the upper part of layer 420 opposite the bottom electrode. Of course, various other techniques may be incorporated to form collar structure 1405, as would be apparent to one of ordinary skill in the art.

However, because collar 1405 is located substantially below the bottom electrode, it may be formed of metal rather than dielectric layer. Notably, there are two advantages of using metal layer to form collar 1405. First, some metal materials have generally significantly higher acoustic impedance than dielectric materials (molybdenum or tungsten, for example), so matching of modal distributions in the active region and collar 1405 regions of FBAR 1400 may be improved, yielding possible further improvements in Rp and Q-factor values. Second, metal collar 1405 may form a current redistribution layer which may result in lower electrical contribution to series resistance Rs of FBAR 1405.

Figure 15:
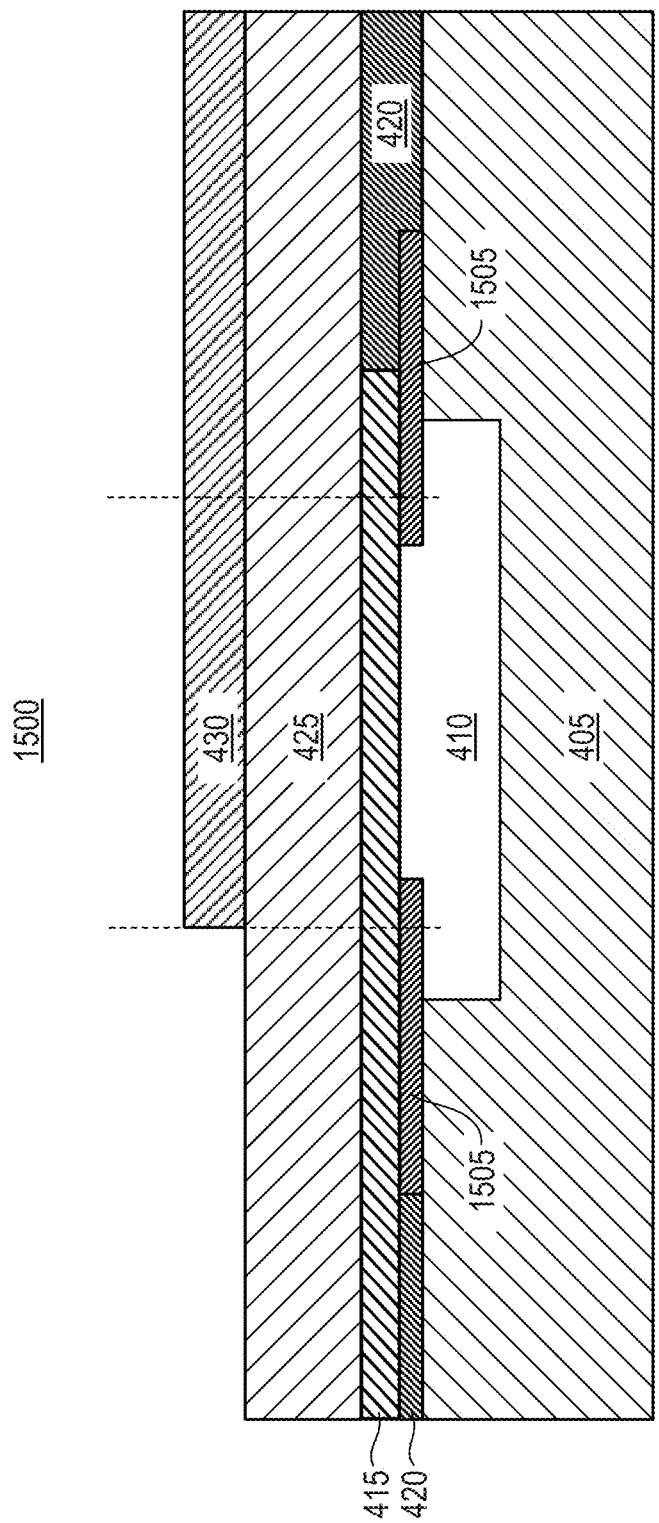
FIG. 15 is a cross-sectional view of an FBAR comprising a collar/frame structure formed between a bottom electrode and a substrate according to another representative embodiment.

FIG. 15 is a cross-sectional view of an FBAR 1500 comprising a collar/frame structure formed between a bottom electrode and a substrate according to another representative embodiment.

Referring to FIG. 15, FBAR 1500 is similar to FBAR 1400, except that it comprises a collar/frame structure 1505 that extends into the active region, i.e., beyond the edges of top electrode 430. Similar to collar structure 1405, the width and thickness of collar/frame structure 1505 can be adjusted such that cutoff frequencies and mode profiles in the active region and the collar region essentially match. These and other adjustments can be made to this and other embodiments through processes such as simulation, experimentation, or mathematical modeling, for instance.

In the above-described embodiments, collar structures and collar/frame structures can generally be formed using conventional processing techniques, with examples including various forms of deposition, etching, polishing, and so on. Moreover, the described embodiments and related methods of fabrication can be modified in various ways as will be apparent to those skilled in the art. While example embodiments are disclosed herein, one of ordinary skill in the art appreciates that many variations that are in accordance with the present teachings are possible and remain within the scope of the appended claims. For instance, one type of variation may involve combining collars in different layers, or collar/frames in some layers with collars in other layers. Another example type of variation may involve adjustment to various parameters such as the widths of the collars in different layers or forming collars which do not enclose completely the FBAR structure, for example. Yet another type of variation may involve collars or collar/frames formed directly on top of piezoelectric layer without planarization layer 505 shown in FIG. 5A, for instance. Another illustrative example of variation may involve formation of the collar layer inside top or bottom electrodes or piezoelectric layer, for instance. These and other variations would become clear to one of ordinary skill in the art after inspection of the specification, drawings and claims herein. The invention therefore is not to be restricted except within the spirit and scope of the appended claims.

The invention claimed is:

1. A bulk acoustic wave (BAW) resonator structure, comprising:
    a substrate comprising a trench;
    a first electrode disposed over the substrate;
    a piezoelectric layer disposed over the first electrode;
    a second electrode disposed over the piezoelectric layer;
    a collar structure comprising a dielectric material of predetermined width and height disposed around a perimeter of an active region, which is defined by an overlap between the first electrode, the second electrode, the piezoelectric layer, and the trench; and
    a first planarization layer formed on the piezoelectric layer adjacent to the second electrode, the first planarization layer comprising a first layer having a first acoustic impedance and a second layer formed on the first layer and having a second acoustic impedance lower than the first acoustic impedance.

2. The BAW resonator structure of claim 1, wherein the collar structure is formed over a first planarization layer and the second electrode.

3. The BAW resonator structure of claim 1, wherein the first layer comprises silicon carbide and the second layer comprises non-etchable borosilicate glass.

4. The BAW resonator structure of claim 1, wherein the collar structure has an inner edge that extends into the active region.

5. The BAW resonator structure of claim 1, wherein the collar structure further comprises an integrated frame.

6. The BAW resonator structure of claim 1, wherein the dielectric material comprises non-etchable borosilicate glass (NEBSG), carbon-doped silicon oxide (CDO), silicon carbide, silicon nitride, aluminum oxide, aluminum nitride, zinc oxide, or diamond.

7. The BAW resonator structure of claim 1, wherein the collar structure is formed on the first electrode.

8. The BAW resonator structure of claim 1, wherein the collar structure is formed between the first electrode and the piezoelectric layer.

9. The BAW resonator structure of claim 8, wherein the dielectric material comprises carbon doped silicon oxide.

10. The BAW resonator structure of claim 1, wherein the collar structure is formed between the substrate and the first electrode.

11. The BAW resonator structure of claim 1, wherein the trench comprises an air gap, and the first electrode is formed on the substrate over the air gap, and the collar structure extends into a region over the air gap.

12. The BAW resonator structure of claim 11, further comprising a second planarization layer formed on the substrate adjacent to the first electrode, wherein the collar structure is formed on the second planarization layer and the first electrode.

13. A bulk acoustic wave (BAW) resonator structure, comprising:
    a first electrode disposed over a substrate;
    a first piezoelectric layer disposed over the first electrode;
    a second electrode disposed over the first piezoelectric layer; and
    a collar structure comprising a dielectric material of predetermined width and height disposed around a perimeter of an active region which is defined by an overlap between the first electrode, the second electrode and the piezoelectric layer, the collar structure having an inner edge that is substantially aligned with an outer edge of the second electrode, wherein the collar structure is disposed on the first electrode, or between the first electrode and the piezoelectric layer.

14. The BAW resonator structure of claim 13, further comprising an acoustic mirror formed between the first electrode and the substrate.

15. The BAW resonator structure of claim 13, wherein the dielectric material comprises non-etchable borosilicate glass (NEBSG), carbon-doped silicon oxide (CDO), silicon carbide, silicon nitride, aluminum oxide, aluminum nitride, zinc oxide, or diamond.

16. The BAW resonator structure of claim 13, wherein the dielectric material comprises carbon doped silicon oxide.

17. The BAW resonator structure of claim 13, further comprising a planarization layer formed on the piezoelectric layer adjacent to the second electrode.

18. The BAW resonator structure of claim 13, wherein the substrate has a trench containing an air gap, and the first electrode is formed on the substrate over the air gap, and the collar structure extends into a region over the air gap.

19. The BAW resonator structure of claim 18, wherein the collar structure is disposed on the first electrode and the BAW resonator structure further comprising a planarization layer formed on the substrate adjacent to the first electrode, wherein the collar structure is formed on the planarization layer and the first electrode.

20. The BAW resonator structure of claim 13, wherein the collar structure further comprises an integrated frame.

21. A bulk acoustic wave (BAW) resonator structure, comprising:
- a first electrode disposed over a substrate;
- a piezoelectric layer disposed over the first electrode;
- a second electrode disposed over the piezoelectric layer; and
- a collar structure comprising a dielectric material of predetermined width and height disposed around a perimeter of an active region which is defined by an overlap between the first electrode, the second electrode and the piezoelectric layer, the collar structure having a cutoff frequency that is substantially the same as a cutoff frequency of the active region.

22. The BAW resonator structure of claim 21, wherein the collar structure has an inner edge that extends into the active region.

23. The BAW resonator structure of claim 21, further comprising an acoustic mirror formed between the first electrode and the substrate.

24. The BAW resonator structure of claim 21, wherein the dielectric material comprises non-etchable borosilicate glass (NEBSG), carbon-doped silicon oxide (CDO), silicon carbide, silicon nitride, aluminum oxide, aluminum nitride, zinc oxide, or diamond.

25. The BAW resonator structure of claim 21, wherein the collar structure is formed on the first electrode.

26. The BAW resonator structure of claim 21, wherein the collar structure is formed between the first electrode and the piezoelectric layer.

27. The BAW resonator structure of claim 26, wherein the dielectric material comprises carbon doped silicon oxide.

28. The BAW resonator structure of claim 21, wherein the collar structure is formed between the substrate and the first electrode.

29. The BAW resonator structure of claim 21, wherein the collar structure further comprises an integrated frame.

30. The BAW resonator structure of claim 21, further comprising a planarization layer formed on the piezoelectric layer adjacent to the second electrode.

31. The BAW resonator structure of claim 21, wherein the collar structure is formed over a planarization layer formed on the piezoelectric layer and the second electrode.

32. The BAW resonator structure of claim 31, wherein the planarization layer comprises a first layer having a first acoustic impedance and a second layer formed on the first layer and having a second acoustic impedance lower than the first acoustic impedance.

33. The BAW resonator structure of claim 32, wherein the first layer comprises silicon carbide and the second layer comprises non-etchable borosilicate glass.

34. The BAW resonator structure of claim 21, wherein the substrate has a trench containing an air gap, and the first electrode is formed on the substrate over the air gap, and the collar structure extends into a region over the air gap.

35. The BAW resonator structure of claim 34, further comprising a planarization layer formed on the substrate adjacent to the first electrode, wherein the collar structure is formed on the planarization layer and the first electrode.

36. A bulk acoustic wave (BAW) resonator structure, comprising:
- a substrate comprising a trench;
- a first electrode disposed over the substrate;
- a piezoelectric layer disposed over the first electrode;
- a second electrode disposed over the piezoelectric layer; and
- a collar structure disposed around a perimeter of an active region, which is defined by an overlap between the first electrode, the second electrode, the piezoelectric layer, and the trench, wherein the collar structure comprises a region of dielectric material having a predetermined thickness and width, and having a cutoff frequency substantially matched to a cutoff frequency of the active region.

37. The BAW resonator structure of claim 36, wherein the collar structure has an inner edge that extends into the active region.

38. The BAW resonator structure of claim 36, wherein the dielectric material comprises non-etchable borosilicate glass (NEBSG), carbon-doped silicon oxide (CDO), silicon carbide, silicon nitride, aluminum oxide, aluminum nitride, zinc oxide, or diamond.

39. The BAW resonator structure of claim 36, wherein the dielectric material comprises carbon doped silicon oxide.

40. The BAW resonator structure of claim 36, wherein the collar structure is formed between the substrate and the first electrode.

41. The BAW resonator structure of claim 36, further comprising a planarization layer formed on the piezoelectric layer adjacent to the second electrode.

42. The BAW resonator structure of claim 36, wherein the collar structure is formed over a planarization layer and the second electrode.

43. The BAW resonator structure of claim 42, wherein the planarization layer comprises a first layer having a first acoustic impedance and a second layer formed on the first layer and having a second acoustic impedance lower than the first acoustic impedance.

44. The BAW resonator structure of claim 36, wherein the substrate has a trench containing an air gap, and the first electrode is formed on the substrate over the air gap, and the collar structure extends into a region over the air gap.

45. The BAW resonator structure of claim 44, further comprising a planarization layer formed on the substrate adjacent to the first electrode, wherein the collar structure is formed on the planarization layer and the first electrode.

46. The BAW resonator structure of claim 36, wherein the collar structure further comprises an integrated frame.

* * * * *